(12) United States Patent
Cho et al.

(10) Patent No.: US 12,310,066 B2
(45) Date of Patent: May 20, 2025

(54) DISPLAY DEVICE AND METHOD OF FABRICATING THE SAME

(71) Applicant: Samsung Display Co., Ltd., Yongin-Si (KR)

(72) Inventors: Sung Won Cho, Hwaseong-si (KR); Yun Jong Yeo, Hwaseong-si (KR); Yu Gwang Jeong, Anyang-si (KR); Jae Hwan Chu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 508 days.

(21) Appl. No.: 17/702,670

(22) Filed: Mar. 23, 2022

(65) Prior Publication Data

US 2023/0065849 A1   Mar. 2, 2023

(30) Foreign Application Priority Data

Aug. 27, 2021   (KR) .......................... 10-2021-0113975

(51) Int. Cl.
*H01L 29/786*   (2006.01)
*H10D 30/01*   (2025.01)
*H10D 30/67*   (2025.01)
*H10K 59/121*   (2023.01)
(Continued)

(52) U.S. Cl.
CPC ....... *H10D 30/6755* (2025.01); *H10D 30/031* (2025.01); *H10K 59/1213* (2023.02); *H10K 59/131* (2023.02); *H10K 59/1201* (2023.02)

(58) Field of Classification Search
CPC ........... H01L 29/7869; H01L 29/66742; H01L 27/1248; H01L 27/1259; H01L 27/1237; H10K 59/1213; H10K 59/131; H10K 59/1201; H10K 59/121; H10K 59/123; H10D 30/6755; H10D 30/031; H10D 86/021; H10D 10/821; H10D 10/021
See application file for complete search history.

(56) References Cited

U.S. PATENT DOCUMENTS 7,989,899 B2 *   8/2011   Yin ..................... H01L 29/7869
                                                            257/69
2023/0075763 A1   3/2023   Kim et al.

FOREIGN PATENT DOCUMENTS

| EP | 4160682 A1 | 4/2023 |
| KR | 10-0874647 B1 | 12/2008 |
| KR | 10-2023-0037729 A | 3/2023 |

* cited by examiner

Primary Examiner — Cuong B Nguyen
(74) Attorney, Agent, or Firm — Innovation Counsel LLP

(57) ABSTRACT

A display device is disclosed that includes a substrate, a semiconductor layer, a first conductive layer, and a first gate insulating layer. The semiconductor layer is disposed on the substrate and includes a first area and a second area. The first conductive layer is disposed on the semiconductor layer and includes a first gate pattern overlapping the first area and a second gate pattern overlapping the second area. The first gate insulating layer is disposed between the semiconductor layer and the first conductive layer and includes a first insulating layer overlapping the first area and the second area, a second insulating layer overlapping the first area and the second area, and a third insulating layer not overlapping the first area but overlapping the second area. The second insulating layer is disposed between the first insulating layer and the third insulating layer, and has a dielectric constant greater than that of the third insulating layer.

10 Claims, 27 Drawing Sheets

(51) Int. Cl.
 *H10K 59/131* (2023.01)
 *H10K 59/12* (2023.01)

DT: ST1
SW: SW1, SW2
SW1: ST2, ST3, ST4
SW2: ST5, ST6, ST7

ACTL1: ACT1
ACTL2a: ACT4
GAT1: G1
GAT2a: G4
1300: 1310, 1330, 1350

ACTL2b: ACT5
CDL1: G5
CDL3: S5, D5
CDL4: CNE5
LEL: 1910, 1930, 1950
2000: 2100, 2300, 2500

ACTL2b: ACT5
GAT2b: G5
1300: 1310, 1330

ACTL: ACTL1, ACTL2
ACTL2: ACTL2a, ACTL2b
CDL1: GAT1, GAT2
GAT2: GAT2a, GAT2b
1300: 1310, 1330, 1350

1304: 1310, 1330, 1350
1314: 1314_a, 1314_b

1306: 1315, 1336

DISPLAY DEVICE AND METHOD OF FABRICATING THE SAME

This application claims priority from Korean Patent Application No. 10-2021-0113975 filed on Aug. 27, 2021 in the Korean Intellectual Property Office, the disclosure of which is incorporated herein by reference in its entirety.

BACKGROUND

1. Field of the Disclosure

The present disclosure relates to a display device and a method of fabricating the same.

2. Description of the Related Art

Display devices become more and more important as multimedia technology evolves. In accordance with this, a variety of types of display devices including a self-luminous display device such as organic light-emitting display (OLED) devices and liquid-crystal display (LCD) devices are being used.

Among display devices, a display device including self-luminous elements includes light-emitting diodes which are light-emitting elements, and a plurality of thin-film transistors connected to the light-emitting diodes. A thin-film transistor may include a channel region, and source and drain regions of a polysilicon film. When a thin-film transistor is turned on in an operating voltage range, current flows through the channel region of the thin-film transistor. When the thin-film transistor is turned off in a non-operating voltage range, current does not flow through the channel region of the thin-film transistor.

SUMMARY

Aspects of the disclosure provide a display device that may ensure stability of thin-film transistors.

Aspects of the disclosure also provide a method of fabricating a display device that may ensure stability of thin-film transistors.

It should be noted that aspects of the disclosure are not limited to the above-mentioned aspects, and other aspects of the disclosure will be apparent to those skilled in the art from the following descriptions.

According to an embodiment of the disclosure, a display device may include a substrate; a semiconductor layer disposed on the substrate and comprising a first area and a second area; a first conductive layer disposed on the semiconductor layer and comprising a first gate pattern overlapping with the first area and a second gate pattern overlapping with the second area; and a first gate insulating layer disposed between the semiconductor layer and the first conductive layer and comprising a first insulating layer overlapping the first area and the second area, a second insulating layer overlapping the first area and the second area, and a third insulating layer not overlapping the first area but overlapping the second area, wherein the second insulating layer is disposed between the first insulating layer and the third insulating layer, and has a dielectric constant greater than that of the third insulating layer.

A second insulating layer may have a higher dielectric constant than that of the first insulating layer.

A first insulating layer may include silicon oxide and have a thickness of 600 Å to 1,200 Å, and wherein the second insulating layer may have a thickness of 100 Å to 300 Å.

An equivalent oxide thickness of a part of the first gate insulating layer which overlaps the first area may be less than an equivalent oxide thickness of a part of the first gate insulating layer which overlaps the second area.

The equivalent oxide thickness of the part of the first gate insulating layer which overlaps the first area may range from 1,000 Å to 1,500 Å, and the equivalent oxide thickness of the part of the first gate insulating layer which overlaps with the second area may range from 1,250 Å to 1,750 Å.

The equivalent oxide thickness of a part of the first gate insulating layer which overlaps the second area may be greater than the equivalent oxide thickness of a part of the first gate insulating layer which overlaps with the first area by 250 Å to 300 Å.

The display device may further include a light-emitting element disposed on the substrate, wherein the second area and the second gate pattern forms a driving transistor configured to receive a driving voltage to supply a driving current to the light-emitting element, and wherein the first area and the first gate pattern forms a switching transistor configured to transmit a data signal to the driving transistor.

An interatomic bonding energy of a material of the second insulating layer may be greater than an interatomic bonding energy of a material of the third insulating layer.

The dielectric constant of the second insulating layer may be greater than or equal to 8 and less than or equal to 30.

The first insulating layer may include silicon oxide, the second insulating layer may include at least one of aluminum oxide ($Al_2O_3$), zirconium oxide ($ZrO_2$), hafnium oxide ($HfO_2$), yttrium oxide ($Y_2O_3$), tantalum pentoxide ($Ta_2O_5$), and cerium oxide ($CeO_2$), and the third insulating layer may include silicon nitride.

According to an embodiment of the disclosure, a display device may include a substrate; a semiconductor layer disposed on the substrate and comprising a first area and a second area; a first conductive layer disposed on the semiconductor layer and comprising a first gate pattern overlapping the first area and a second gate pattern overlapping the second area; and a first gate insulating layer disposed between the semiconductor layer and the first conductive layer and comprising a first insulating layer overlapping the first area and the second area, and a second insulating layer not overlapping the first area but overlapping the second area, wherein the first insulating layer has a dielectric constant greater than that of the second insulating layer, and wherein the second insulating layer is disposed on the first insulating layer.

The dielectric constant of the first insulating layer may be greater than or equal to 8 and less than or equal to 30.

The first insulating layer may include at least one of aluminum oxide ($Al_2O_3$), zirconium oxide ($ZrO_2$), hafnium oxide ($HfO_2$), yttrium oxide ($Y_2O_3$), tantalum pentoxide ($Ta_2O_5$), and cerium oxide ($CeO_2$), and wherein the second insulating layer may include silicon nitride.

An equivalent oxide thickness of a part of the first gate insulating layer which overlaps the first area is less than an equivalent oxide thickness of a part of the first gate insulating layer which overlaps with the second area.

The equivalent oxide thickness of the part of the first gate insulating layer which overlaps the second area may range from 1,250 Å to 1,750 Å, and the part of the first gate insulating layer which overlaps with the first area may range from 1,000 Å to 1,500 Å.

The equivalent oxide thickness of a part of the first gate insulating layer which overlaps with the first area may be less than the equivalent oxide thickness of a part of the first gate insulating layer which overlaps with the second area by 250 Å to 300 Å.

The first insulating layer may have a thickness of 2,060 Å to 3,070 Å.

An interatomic bonding energy of a material of the first insulating layer is greater than an interatomic bonding energy of a material of the second insulating layer.

According to an embodiment of the disclosure, a method of manufacturing display device may include forming a semiconductor layer including a first area and a second area on a substrate; sequentially forming a first insulating layer on the semiconductor layer, a second insulating layer on the first insulating layer, and a third insulating layer on the second insulating layer; forming a photoresist layer overlapping the first area on the third insulating layer; etching a part of the third insulating layer that overlaps the second area using the photoresist layer as an etch stop layer; and removing the photoresist layer and then forming a first gate pattern on the third insulating layer overlapping the first area and a second gate pattern on the second insulating layer overlapping the second area, wherein a dielectric constant of the second insulating layer is greater than a dielectric constant of the first insulating layer and a dielectric constant of the third insulating layer.

The etching of the third insulating layer may include dry etching using a fluorine-based compound and $O_2$ plasma, and wherein an etch selectivity between the third insulating layer and the second insulating layer is equal to or greater than 1.5.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

It will be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the disclosure will be described with reference to the accompanying drawings.

Figure 1:
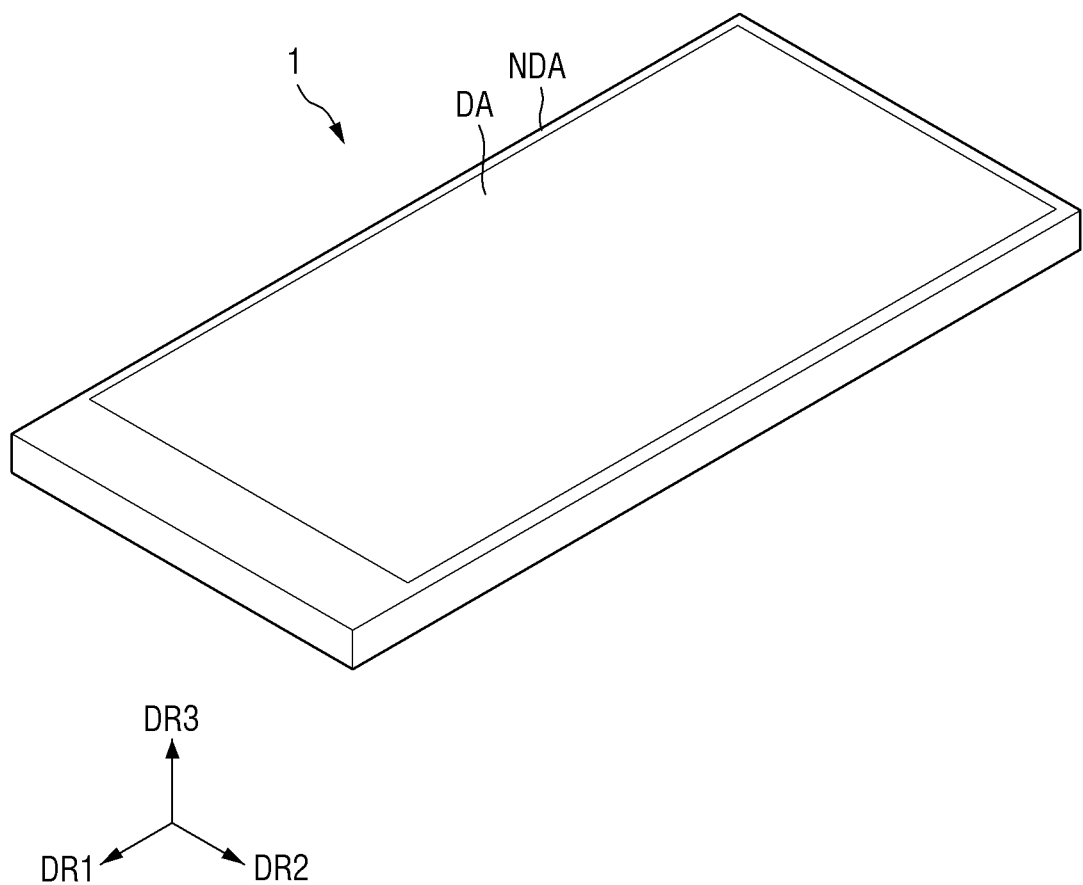
FIG. 1 is a plan view showing a display device according to an embodiment of the disclosure.
Figure 2:
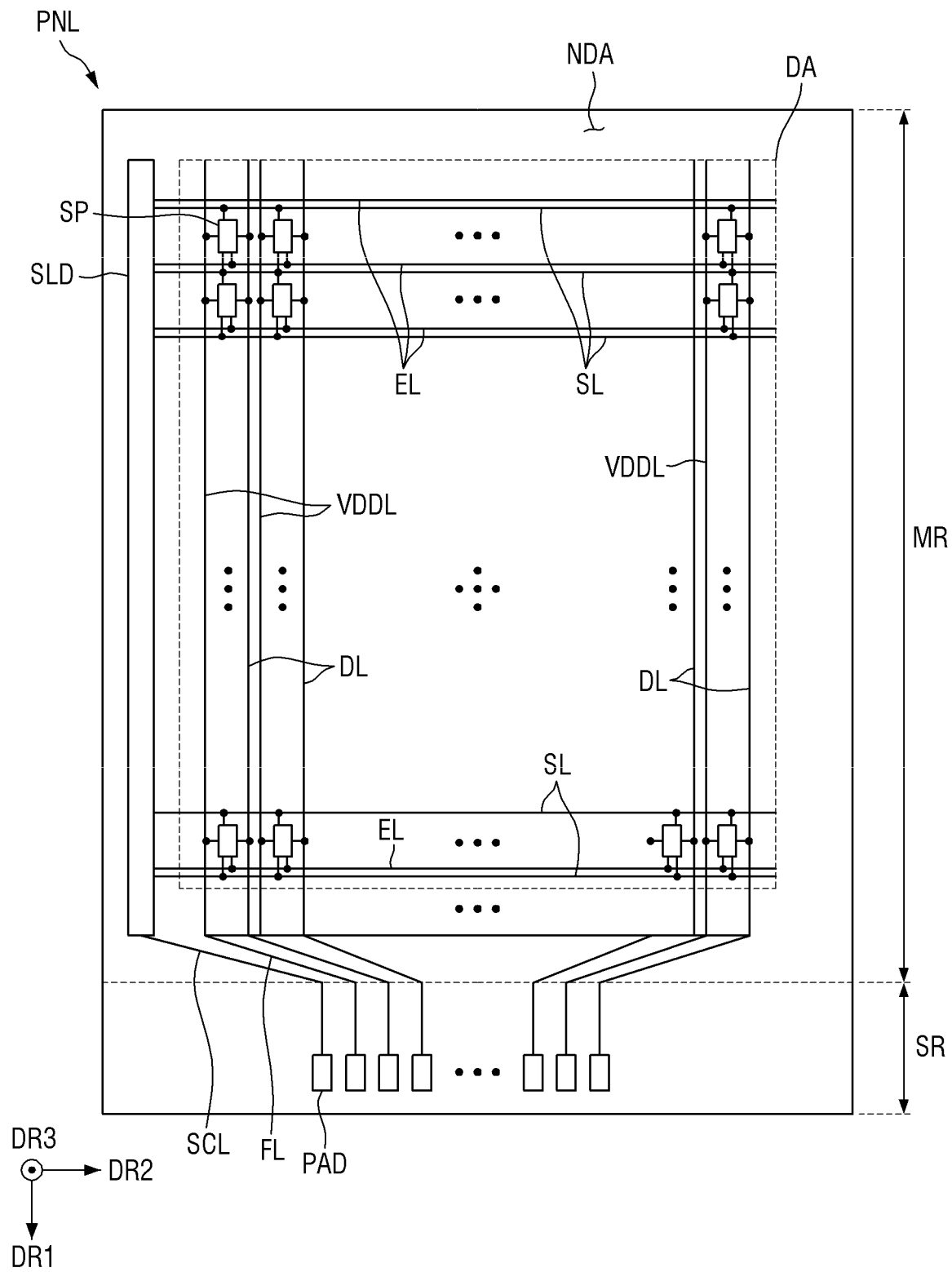
FIG. 2 is a plan view schematically showing the circuit structure of the display device according to the embodiment of FIG. 1

FIG. 1 is a plan view showing a display device according to an embodiment of the disclosure. FIG. 2 is a plan view schematically showing the circuit structure of the display device according to the embodiment of FIG. 1.

Referring to FIGS. 1 and 2, a display device 1 according to an embodiment may be a device for displaying a moving image or still image, and may be used as a display screen for a portable electronic device such as a tablet PC, a smart phone, a mobile communication terminal and an e-book as well as a display screen for various devices such as a television set, a laptop computer and a monitor.

The display device 1 has a three-dimensional shape. In the drawings, the direction parallel to a first side (vertical side) of the display device 1 is referred to as a first direction DR1, the direction parallel to a second side (horizontal side) of the display device 1 is referred to as a second direction DR2, and the thickness direction of the display device 1 is referred to as a third direction DR3. As used herein, directions may refer to two directions toward one side and the opposite side unless specifically stated otherwise. If it is necessary to discern between two opposite directions, the side in one of the two directions may be referred to as "one side in the direction," while the opposite side in the other one may be referred to as "the opposite side in the direction." In FIG. 1, the side indicated by the arrow of a direction is referred to as one side in the direction, while the opposite side is referred to as the opposite side in the direction. The first direction DR1 and the second direction DR2 may intersect each other or may be perpendicular to each other. The second direction DR2 and the third direction DR3 may intersect each other or may be perpendicular to each other. The first direction DR1 and the third direction DR3 may intersect each other or may be perpendicular to each other. In some embodiments, the display device 1 may have a rectangular shape in which the vertical sides are longer than the horizontal sides when viewed from the top as shown in FIG. 1, but the disclosure is not limited thereto. For example, the corners where the first sides and the second sides of the display device 1 meet may be rounded to have a predetermined curvature, or the shape may not be limited to the rectangular shape but may be formed in any other polygonal shape, a circular shape, or an oval shape.

The display device 1 according to an embodiment may include a display panel PNL.

The display panel PNL displays images thereon. Any kind of display panel may be employed as the display panel PNL according to the embodiment, such as an organic light-emitting display panel including an organic light-emitting layer, a micro light-emitting diode display panel using micro LEDs, a quantum-dot light-emitting display panel using quantum-dot light-emitting diodes including quantum-dot light-emitting layer, and an inorganic light-emitting display panel using inorganic light-emitting elements including an inorganic semiconductor. Referring to FIG. 1, the display panel PNL may display images on one side in the third direction DR3.

In some embodiments, the display panel PNL may include a main region MR and a subsidiary region SR disposed on one side of the main region MR in the first direction DR1.

The main region MR may have a shape generally similar to the appearance of the display device 1 when viewed from the top. The main region MR may be a flat region located in one plane.

The subsidiary region SR is extended from the main region MR. The width of the subsidiary region SR in the second direction DR2 may be, but is not limited to being, equal to the width of the main region MR in the second direction DR2. For example, the width of the subsidiary region SR in the second direction DR2 may be less than the width of the main region MR in the second direction DR2. A plurality of pads PAD electrically connected to a circuit board providing a control signal to the display device 1 may be disposed in the subsidiary region SR.

The display panel PNL may include the display area DA where images are displayed, and the non-display area NDA where no image is displayed. The display area DA and the non-display area NDA of the display panel PNL may also be applied to the display device 1. The display area DA of the display panel PNL is disposed in the main region MR. Specifically, the display area DA may be located at the center portion of the main region MR except for edge portions.

The non-display area NDA may be disposed around the display area DA. That is to say, the remaining portion of the display panel PNL excluding the display area DA becomes the non-display area NDA of the display panel PNL. In an embodiment, the border of the display area DA of the main region MR and the entire subsidiary region SR may be the non-display area NDA. It is, however, to be understood that the disclosure is not limited thereto. The subsidiary region SR may also include the display area DA.

In the display area DA, a plurality of sub-pixels SP, as well as first supply voltage lines VDDL, data lines DL, scan lines SL, and emission lines EL connected to the plurality of sub-pixels SP may be disposed.

The first supply voltage lines VDDL may supply the supply voltage to the sub-pixels SP. In some embodiments, the first supply voltage lines VDDL may be extended in the first direction DR1 and be spaced apart from and parallel to one another in the second direction DR2 in the display area DA. In some embodiments, the first supply voltage lines VDDL formed in parallel in the first direction DR1 in the display area DA may be connected to one another in the non-display area NDA. Although not shown in the drawings, in some embodiments, supply voltage lines extended in the second direction DR2 and connected to the first supply voltage lines VDDL may be further located in the display area DA.

The data lines DL may provide data signals to the sub-pixels SP. In some embodiments, the data lines DL may be extended along the first direction DR1, may be spaced apart from one another in the second direction DR2, and may be formed in parallel to the first supply voltage lines VDDL.

The scan lines SL may provide scan signals to the sub-pixels SP. In some embodiments, the scan lines SL may be formed in parallel to one another in the second direction DR2 to cross the first supply voltage lines VDDL and the data lines DL.

The emission lines EL may provide voltages required for emitting light to the sub-pixels SP. In some embodiments, the emission lines EL may be formed in parallel in the second direction DR2 to be parallel to the scan lines SL.

The sub-pixels SP may receive signals from the first supply voltage lines VDDL, the data lines DL, the scan lines SL and the emission lines EL and may emit light to output images in the display area DA. Each of the sub-pixels SP may be connected to at least one of the first supply voltage lines VDDL, at least one of the scan lines SL, at least one of the data lines DL, and at least one of the emission lines EL. In the example shown in FIG. 2, each of the sub-pixels SP is connected to two scan lines SL, one data line DL, one emission line EL, and the first supply voltage line VDDL. It is, however, to be understood that the disclosure is not limited thereto. For example, each of the sub-pixels SP may be connected to three scan lines SL rather than two scan lines SL.

A scan driver SLD, the fan-out lines FL and the pads PAD may be disposed in the non-display area NDA.

The scan driver SLD may apply scan signals to the scan lines SL and may apply emission signals to the emission lines EL. The scan driver SLD may be disposed at the opposite end of the non-display area NDA of the main region MR in the second direction DR2, but the disclosure is not limited thereto. For example, the scan driver SLD may be disposed at each of the ends of the non-display area NDA of the main region MR in the second direction DR2. Although not shown in the drawings, the scan driver SLD may include a scan signal output and an emission signal output. The scan signal output may generate scan signals and sequentially output the scan signals to the scan lines SL. The emission signal output may generate emission signals and sequentially output the emission signals to the emission lines EL.

The scan driver SLD may receive a scan control signal and an emission control signal through a scan control line SCL. Although the electrical connection between the scan control line SCL and the display driver circuit is not shown in the drawings, the scan control line SCL may be electrically connected to the display driver circuit to receive the scan control signal and the emission control signal.

The fan-out lines FL may electrically connect the data lines DL with the pads PAD of the subsidiary region SR. As described above, when the width of the subsidiary region SR in the second direction DR2 is smaller than the width of the main region MR in the second direction DR2, the fan-out lines FL may converge on the central portion of the subsidiary area SA in the second direction DR2 between the main region MR and the subsidiary region SR.

The pads PAD may be electrically connected to a circuit board to be described later to receive a control signal from the circuit board and may transmit it to the display panel PNL. The plurality of pads PAD may be disposed at one end of the subsidiary region SR in the first direction DR1 and may be arranged side by side in the second direction DR2 at a predetermined interval.

Although not shown in the drawings, the display device 1 may further include a circuit board, and the pads PAD may be electrically connected to the circuit board. The circuit board may supply a power signal and various control signals to the display panel PNL. The circuit board may be disposed at one end of the subsidiary region SR in the first direction DR1 to be electrically connected to the pads PAD.

Figure 3:
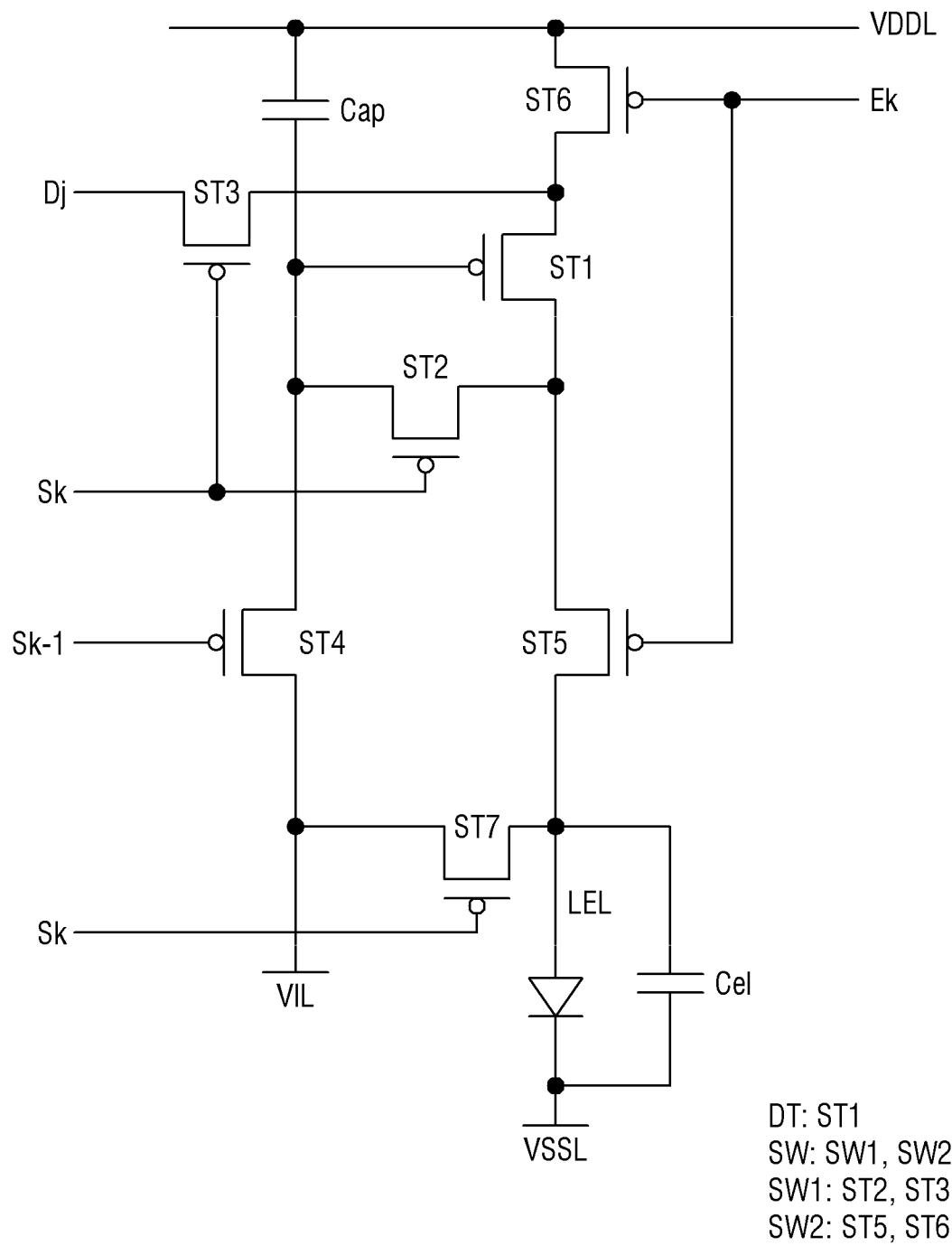
FIG. 3 is a circuit diagram showing a circuit structure of a sub-pixel according to the embodiment of FIG. 1.
Figure 4:
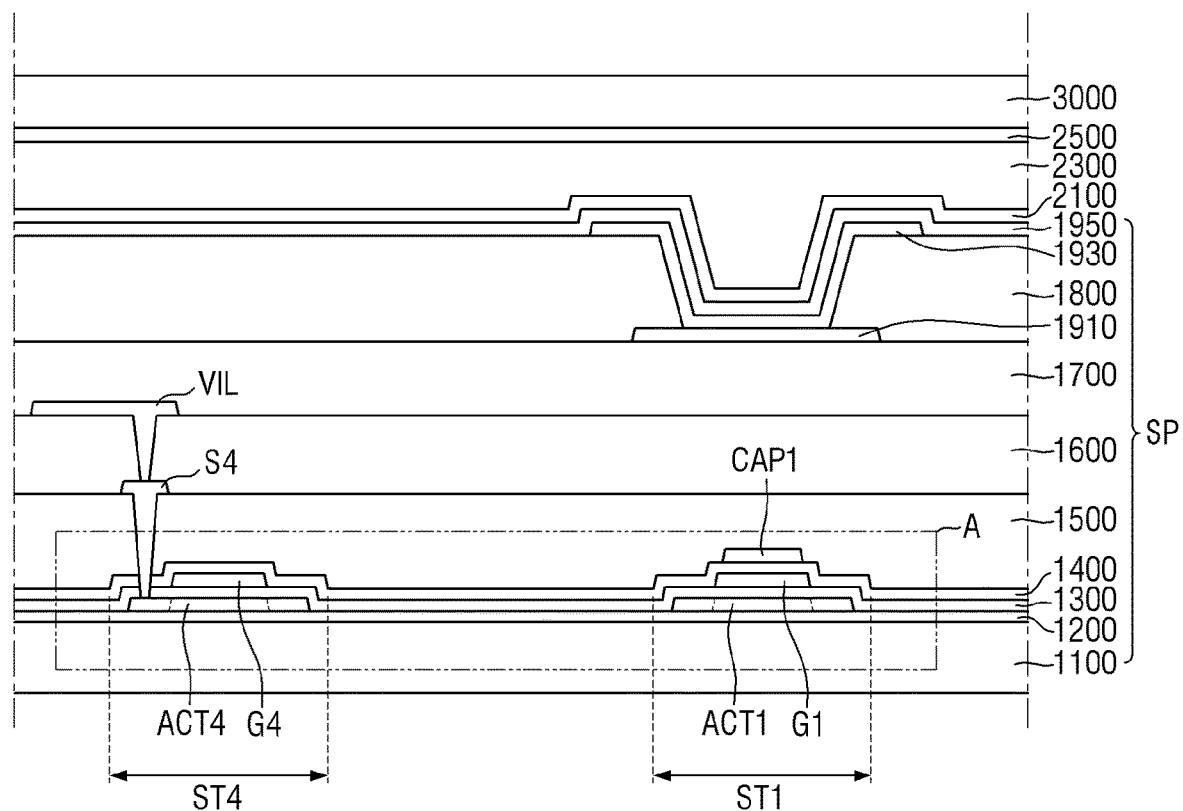
FIG. 4 is a structural diagram schematically showing a structure of a part of a sub-pixel of FIG. 1.
Figure 5:
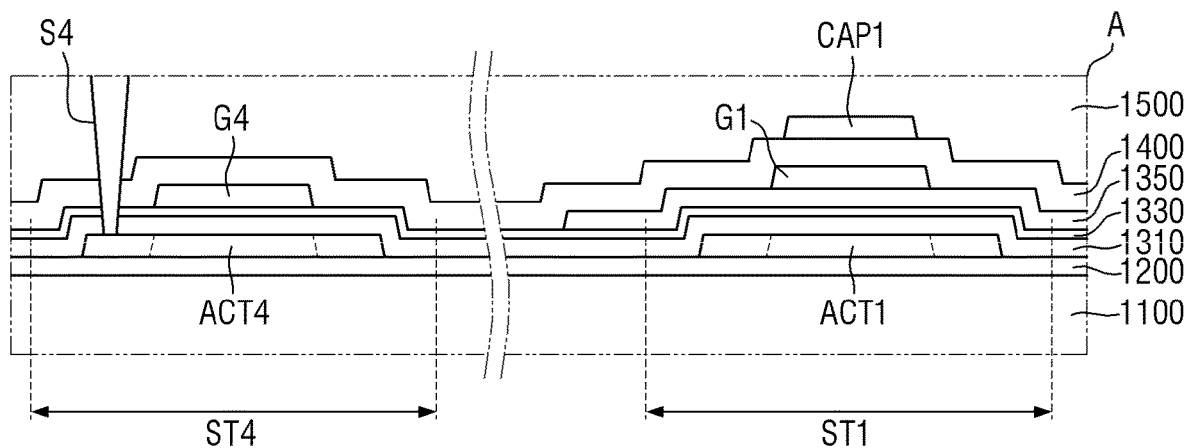
FIG. 5 is an enlarged view of area A of FIG. 4.
Figure 5:
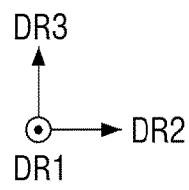
Figure 6:
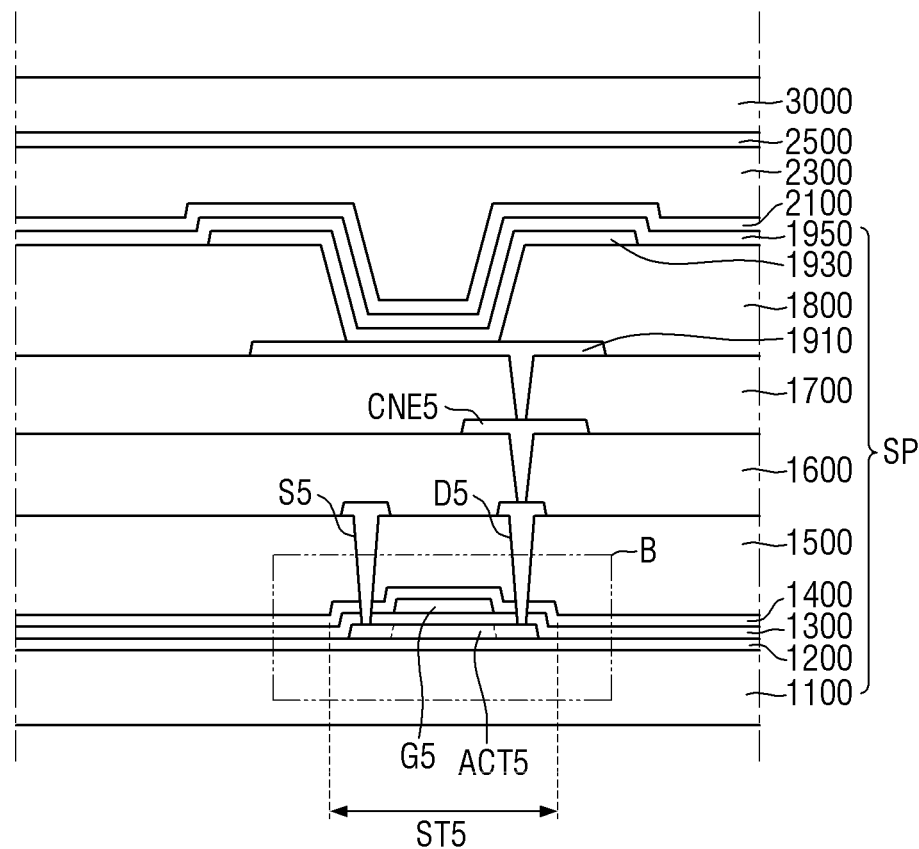
FIG. 6 is a structural diagram schematically showing a structure of a part of a sub-pixel of FIG. 1.
Figure 6:
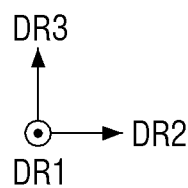
Figure 7:
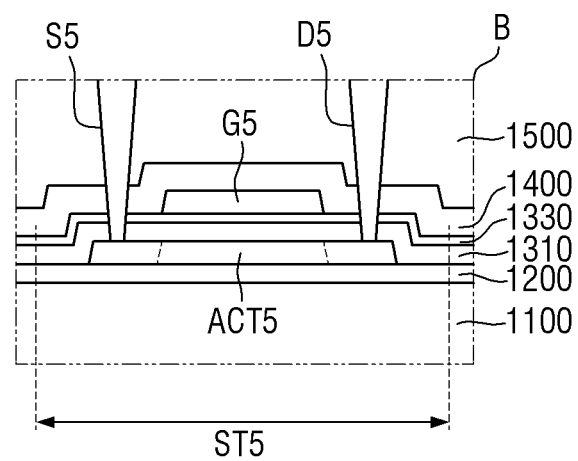
FIG. 7 is an enlarged view of area B of FIG. 6.
Figure 7:
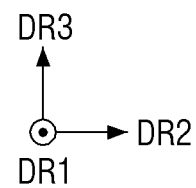

FIG. 3 is a circuit diagram showing a circuit structure of a sub-pixel according to the embodiment of FIG. 1. FIG. 4 is a structural diagram schematically showing a structure of a part of a sub-pixel of FIG. 1. FIG. 5 is an enlarged view of area A of FIG. 4. FIG. 6 is a structural diagram schematically showing a structure of a part of a sub-pixel of FIG. 1. FIG. 7 is an enlarged view of area B of FIG. 6.

Referring to FIG. 3, the sub-pixel SP may be connected to the $(k-1)^{th}$ scan line S(k-1), the $k^{th}$ scan line Sk, and the $j^{th}$ data line Dj, where k and j are natural numbers equal to or greater than one. In addition, the sub-pixel SP may be connected to a first supply voltage line VDDL from which a first supply voltage is applied, an initialization voltage line VIL from which an initialization voltage is applied, and a second supply voltage line VSSL from which a second supply voltage lower than the first supply voltage is applied. In addition, the sub-pixel SP includes a thin-film transistor, a light-emitting element LEL, and a capacitor. The thin-film transistor includes a driving transistor DT and a switching transistor SW. The driving transistor DT may receive the first supply voltage or the second supply voltage to supply a driving current to the light-emitting element LEL, and the switching transistor SW may transmit a data signal to the driving transistor DT. The sub-pixel SP may include a first thin-film transistor ST1 as the driving transistor DT, a second thin-film transistor ST2, a third thin-film transistor ST3, a fourth thin-film transistor ST4, a fifth thin-film transistor ST5, a sixth thin-film transistor ST6 and a seventh thin-film transistor as the switching transistors SW, and a first electrode, a second electrode and an emissive layer as the light-emitting element LEL. The switching transistor SW may include a first switching transistor SW1 and a second switching transistor SW2. The first switching transistor SW1 may include second to fourth thin-film transistors ST2, ST3 and ST4, and the second switching transistor SW2 may include fifth to seventh thin-film transistors ST5, ST6 and ST7.

The first thin-film transistor ST1 may include a first gate electrode, a first semiconductor pattern layer, a first electrode, a second electrode, etc. The first thin-film transistor ST1 controls a drain-source current flowing between the first electrode and the second electrode in response to the data voltage applied to the first gate electrode. The driving current flowing through the channel of the first thin-film transistor ST1 is proportional to the square of the difference between the threshold voltage and the voltage between the first gate electrode and the first electrode of the first thin-film transistor ST1 as shown in Equation 1 below:

$$Ids = k' \times (Vgs - Vth)^2 \qquad \text{[Equation 1]}$$

where k' denotes a proportional coefficient determined by the structure and physical properties of the first thin-film transistor ST1, Vgs denotes the gate-source voltage of the first thin-film transistor ST1, Vth denotes the threshold voltage of the first thin-film transistor ST1, and Ids denotes the driving current.

The light-emitting element LEL may emit light in response to the driving current. The amount of the light emitted from the light-emitting element LEL may be proportional to the driving current. The light-emitting element LEL may include a first electrode, a second electrode, and an emissive layer disposed between the first electrode and the second electrode. The first electrode may be an anode electrode, and the second electrode may be a cathode electrode.

The first electrode of the light-emitting element LEL may be connected to the first electrode of the seventh transistor ST7 and the second electrode of the fifth thin-film transistor ST5, while the second electrode may be connected to the second supply voltage line VSSL.

The second thin-film transistor ST2 is turned on by the scan signal of the $k^{th}$ scan line Sk to connect the first gate electrode with the second electrode of the first thin-film transistor ST1. Specifically, when the second thin-film transistor ST2 is turned on, the first gate electrode and the second electrode of the first thin-film transistor ST1 are connected, and accordingly the first thin-film transistor ST1 is driven as a diode. The second thin-film transistor ST2 may include a second gate electrode, a second semiconductor pattern layer, a first electrode, and a second electrode. The second gate electrode may be connected to the $k^{th}$ scan line Sk, the first electrode of the second thin-film transistor ST2 may be connected to the second electrode of the first thin-film transistor ST1, and the second electrode of the second thin-film transistor ST2 may be connected to the first gate electrode of the first thin-film transistor ST1.

The third thin-film transistor ST3 is turned on by the scan signal of the $k^{th}$ scan line Sk to connect the first electrode of the first thin-film transistor ST1 with the $j^{th}$ data line Dj. The third thin-film transistor ST3 may include a third gate electrode, a third semiconductor pattern layer, a first electrode, and a second electrode. The third gate electrode of the third thin-film transistor ST3 may be connected to the $k^{th}$ scan line Sk, the first electrode of the third thin-film transistor ST3 may be connected to the first electrode of the first thin-film transistor ST1, and the second electrode of the third thin-film transistor ST3 may be connected to the $j^{th}$ data line Dj.

The fourth thin-film transistor ST4 is turned on by the scan signal of the $(k-1)^{th}$ scan line S(k-1) to connect the first gate electrode of the first thin-film transistor ST1 with the initialization voltage line VIL. The first gate electrode of the first thin-film transistor ST1 may be discharged to the initialization voltage of the initialization voltage line VIL. The fourth thin-film transistor ST4 may include a fourth gate electrode, a fourth semiconductor pattern layer, a first electrode, and a second electrode. The fourth gate electrode of the fourth thin-film transistor ST4 may be connected to the $(k-1)^{th}$ scan line S(k-1), the first electrode of the fourth thin-film transistor ST4 may be connected to the first electrode of the first thin-film transistor ST1, and the second electrode of the fourth thin-film transistor ST4 may be connected to the initialization voltage line VIL.

The fifth thin-film transistor ST5 is connected between the second electrode of the first thin-film transistor ST1 and the first electrode of the light-emitting element LEL. The fifth transistor ST5 is turned on by the emission control signal of the $k^{th}$ emission line Ek to connect the second electrode of the first thin-film transistor ST1 with the first electrode of the light-emitting element LEL. The fifth thin-film transistor ST5 may include a fifth gate electrode, a fifth semiconductor pattern layer ACT5, a first electrode, and a second electrode. The fifth gate electrode of the fifth thin-film transistor ST5 is connected to the $k^{th}$ emission line Ek, the first electrode is the fifth thin-film transistor ST5 is connected to the second electrode of the first thin-film transistor ST1, and the second electrode of the fifth thin-film transistor ST5 is connected to the first electrode of the light-emitting element LEL.

The sixth thin-film transistor ST6 is turned on by the emission control signal of the $k^{th}$ emission line Ek to connect the first electrode of the first thin-film transistor ST1 with the first supply voltage line VDDL. The sixth thin-film transistor ST6 may include a sixth gate electrode, a sixth semiconductor pattern layer, a first electrode, and a second electrode. The sixth gate electrode of the sixth thin-film transistor ST6 is connected to the $k^{th}$ emission line Ek, the first electrode of the sixth thin-film transistor ST6 is connected to the first supply voltage line VDDL, and the second electrode of the sixth thin-film transistor ST6 is connected to the first electrode of the first thin-film transistor ST1. When the fifth thin-film transistor ST5 and the sixth thin-film transistor ST6 both are turned on, the driving current can be supplied to the light-emitting element LEL.

The seventh thin-film transistor ST7 is turned on by the scan signal of the $k^{th}$ scan line Sk to connect the first electrode of the light-emitting element LEL with the initialization voltage line VIL. The first electrode of the light-emitting element LEL may be discharged to the initializing voltage. The seventh thin-film transistor ST7 may include a seventh gate electrode, a seventh semiconductor pattern layer, a first electrode, and a second electrode. The seventh gate electrode of the seventh thin-film transistor ST7 may be connected to the $k^{th}$ scan line Sk, the first electrode of the seventh thin-film transistor ST7 may be connected to the first electrode of the light-emitting element LEL, and the second electrode of the seventh thin-film transistor ST7 may be connected to the initialization voltage line VIL.

The capacitor Cap is formed between the first gate electrode of the first thin-film transistor ST1 and the first supply voltage line VDDL. One electrode of the capacitor Cap may be connected to the first gate electrode of the first thin-film transistor ST1, while the other electrode thereof may be connected to the first supply voltage line VDDL.

When the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is a source electrode, the second electrode thereof may be a drain electrode. Alternatively, when the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is a drain electrode, the second electrode thereof may be a source electrode.

Each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 may include the semiconductor layer as described above. Each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 may include, but are not limited to, a semiconductor pattern layer made of polycrystalline silicon.

When each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 is made of polycrystalline silicon, the process of forming it may be a low-temperature polycrystalline silicon process. In addition, the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 are formed of p-type thin-film transistors in the example shown in FIG. 3, the disclosure is not limited thereto. Some or all of them may be formed of n-type thin-film transistors.

As thin-film transistors become smaller, a leakage current may occur in the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. Such a leakage current may disturb the color expression of the sub-pixels SP. Specifically, when the leakage current in each of the second thin-film transistor ST2, the third thin-film transistor ST3 and the fourth thin-film transistor ST4 increases, the driving current generated by the first thin-film transistor ST1 may vary. As a result, the luminance of light emitted from the light-emitting element LEL may be changed based on the driving current. Accordingly, when the leakage current in each of the second thin-film transistor ST2, the third thin-film transistor ST3 and the fourth thin-film transistor ST4 increases, the sub-pixel SP may fail to stably express colors. Accordingly, it is necessary to reduce leakage currents in the second thin-film transistor ST2, the third thin-film transistor ST3 and the fourth thin-film transistor ST4.

In the following description, the stack structure of the display panel PNL in the display area DA will be described in detail.

Referring to FIGS. 4 to 7, the display panel PNL (see FIG. 2) may include a sub-pixel SP, a thin-film encapsulation layer 2000, a touch layer 3000, etc. in the display area DA (see FIG. 2).

The sub-pixel SP may include a substrate 1100, a buffer layer 1200, a semiconductor layer ACTL, a first gate insulating layer 1300, a first conductive layer CDL1, a second gate insulating layer 1400, a second conductive layer CDL2, a first interlayer dielectric layer 1500, a third conductive layer CDL3, a first via insulating layer 1600, a fourth conductive layer CDL4, and a light-emitting element LEL.

The substrate 1100 may work as a base of the display panel PNL. When the substrate 1100 is a flexible substrate having flexibility, the substrate 1100 may include, but is not limited to, polyimide. When the substrate 1100 is a rigid substrate having rigidity, the substrate 1100 may include, but is not limited to, glass.

The buffer layer 1200 can prevent diffusion of metal atoms or impurities from the substrate 1100 into the semiconductor layer ACTL. The buffer layer 1200 may be disposed entirely on the substrate 1100.

The semiconductor layer ACTL may be disposed on the buffer layer 1200 in the display area DA (see FIG. 2) and may receive signals from the scan lines SL and the data lines DL to transmit them to the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. In the following description, the first electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 may be the source electrode, the second electrode thereof may be the drain electrode.

The semiconductor layer ACTL may include a semiconductor pattern layer of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. For example, as shown in FIG. 4, the first thin-film transistor ST1 includes a first semiconductor pattern layer ACT1 and the fourth thin-film transistor ST4 includes a fourth semiconductor pattern layer ACT4. As shown in FIG. 6, the fifth transistor includes a fifth semiconductor pattern layer ACT5. The semiconductor layer ACTL may include a first area ACTL1 and a second area ACTL2. The first area ACTL1 may include the first semiconductor pattern layer ACT1 of the first thin-film transistor ST1. The second area ACTL2 may include the second semiconductor pattern layer of the second thin-film transistor ST2, the third semiconductor pattern layer of the third thin-film transistor ST3, the fourth semiconductor pattern layer ACT4 of the fourth thin-film transistor ST4, the fifth semiconductor pattern layer ACT5 of the fifth thin-film transistor ST5, the sixth semiconductor pattern layer of the sixth thin-film transistor ST6, and the seventh semiconductor pattern layer of the seventh thin-film transistor ST7. The second area ACTL2 may include a (2_1) area ACTL2*a* and a (2_2) area ACTL2*b*. The (2_1) area ACTL2*a* may include the second semiconductor pattern layer of the second thin-film transistor ST2, the third semiconductor pattern layer of the third thin-film transistor ST3, and the fourth semiconductor pattern layer ACT4 of the fourth thin-film transistor ST4. The (2_2) area ACTL2*b* may include the fifth semiconductor pattern layer ACT5 of the fifth thin-film transistor ST5, the sixth semiconductor pattern layer of the sixth thin-film transistor ST6 and the seventh semiconductor pattern layer of the seventh thin-film transistor ST7.

The first semiconductor pattern layer ACT1 may include a first channel region overlapping a first gate electrode G1 to be described later, a first drain region located on one side of the first channel region, and a first source region located on the opposite side of the first channel region. The fourth semiconductor pattern layer ACT4 may include the fourth channel region overlapping a fourth gate electrode G4 to be described later, the fourth drain region located on one side of the fourth channel region, and the fourth source region located on the opposite side of the fourth channel region. The fifth semiconductor pattern layer ACT5 may include the fifth channel region overlapping a fifth gate electrode G5 to be described later, the fifth drain region located on one side of the fifth channel region, and the fifth source region located on the opposite side of the fifth channel region.

The semiconductor layer ACTL may be positioned directly on one surface of the buffer layer 1200. That is to say, the semiconductor layer ACTL may be in direct contact with the surface of the buffer layer 1200. The semiconductor layer ACTL may be selectively patterned and disposed on the buffer layer 1200. In some embodiments, the semiconductor layer ACTL may include, but is not limited to, polycrystalline silicon. For example, the semiconductor layer ACTL may include amorphous silicon, etc.

The first gate insulating layer 1300 can insulate the semiconductor layer ACTL from the first conductive layer CDL1 to be described later. The first gate insulating layer 1300 may be disposed on the buffer layer 1200 on which the semiconductor layer ACTL is disposed to cover the semiconductor layer ACTL. The first gate insulating layer 1300 may be disposed along the profile of the semiconductor layer ACTL. In some embodiments, the first gate insulating layer 1300 may include an inorganic insulating material. In some embodiments, the first gate insulating layer 1300 may be made up of multiple layers. The width of the first gate insulating layer 1300 in the third direction DR3 (hereinafter referred to as thickness) may vary depending on the type of the thin-film transistor. For example, the thickness of the first gate insulating layer 1300 disposed between the semiconductor pattern and the gate electrode of the driving transistor may be greater than the thickness of the first gate insulating layer 1300 disposed between the semiconductor pattern and the gate electrode of the switching transistor SW. The structure of the first gate insulating layer 1300 will be described in more detail later.

The first conductive layer CDL1 may be disposed on the first gate insulating layer 1300. The first conductive layer CDL1 may be positioned directly on one surface of the first gate insulating layer 1300. That is to say, the first conductive layer CDL1 may be in direct contact with the surface of the first gate insulating layer 1300.

The first conductive layer CDL1 may include the gate electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 disposed in the display area DA. For example, the first conductive layer CDL1 may include the first gate electrode G1 of the first thin-film transistor ST1, and the fourth gate electrode G4 of the fourth thin-film transistor ST4 as shown in FIG. 4. As shown in FIG. 6, it may include the fifth gate electrode G5 of the fifth thin-film transistor ST5. As described above, the first gate electrode G1, the fourth gate electrode G4 and the fifth gate electrode G5 may overlap with the first channel region of the first semiconductor pattern layer ACT1, the fourth channel region of the fourth semiconductor pattern layer ACT4 and the fifth channel region of the fifth semiconductor pattern layer ACT5 in the third direction DR3, respectively.

The first conductive layer CDL1 may include a metal. For example, the first conductive layer CDL1 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The first conductive layer CDL1 may include a first gate pattern GAT1 and a second gate pattern GAT2. The first gate pattern GAT1 may include the first gate electrode G1 of the first thin-film transistor ST1. The second gate pattern GAT2 may include the second gate electrode of the second thin-film transistor ST2, the third gate electrode of the third thin-film transistor ST3, the fourth gate electrode G4 of the fourth thin-film transistor ST4, the fifth gate electrode G5 of the fifth thin-film transistor ST5, the sixth gate electrode of the sixth thin-film transistor ST6, and the seventh gate electrode of the seventh thin-film transistor ST7. The second gate pattern GAT2 may include a (2_1) gate pattern GAT2a and a (2_2) gate pattern GAT2b. The (2_1) gate pattern GAT2a may include the second gate electrode of the second thin-film transistor ST2, the third gate electrode of the third thin-film transistor ST3 and the fourth gate electrode G4 of the fourth thin-film transistor ST4. The (2_2) gate pattern GAT2b may include the fifth gate electrode G5 of the fifth thin-film transistor ST5, the sixth gate electrode of the sixth thin-film transistor ST6, and the seventh gate electrode of the thin-film transistor ST7.

The second gate insulating layer 1400 can insulate the first conductive layer CDL1 from the second conductive layer CDL2 to be described later. The second gate insulating layer 1400 may be disposed on the first gate insulating layer 1300 on which the first conductive layer CDL1 is disposed to cover the first conductive layer CDL1. The second gate insulating layer 1400 may be disposed to have substantially the same thickness along the profile of the first conductive layer CDL1. In some embodiments, the second gate insulating layer 1400 may include an inorganic insulating material and may be made up of multiple layers.

The second conductive layer CDL2 may be disposed on the second gate insulating layer 1400. The second conductive layer CDL2 may be positioned directly on one surface of the second gate insulating layer 1400. That is to say, the second conductive layer CDL2 may be in direct contact with the surface of the second gate insulating layer 1400.

The second conductive layer CDL2 may include a capacitor electrode disposed in the display area DA. For example, as shown in FIG. 4, the second conductive layer CDL2 may include a first capacitor electrode CAP1 of the first thin-film transistor ST1. The voltage applied to the first capacitor electrode CAP1 may be equal to the voltage applied to the first supply voltage VDDL. The first capacitor electrode CAP1 may form a capacitor Cap together with the first gate electrode G1 and the second gate insulating layer 1400. The first capacitor electrode CAP1 may overlap with the first gate electrode G1 in the third direction DR3.

The second conductive layer CDL2 may include a metal. For example, the second conductive layer CDL2 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The first interlayer dielectric layer 1500 can insulate the second conductive layer CDL2 from the third conductive layer CDL3 to be described later. The first interlayer dielectric layer 1500 may be disposed on the second gate insulating layer 1400 on which the second conductive layer CDL2 is formed. The first interlayer dielectric layer 1500 may include an inorganic insulating material or an organic insulating material. The first interlayer dielectric layer 1500 may be made up of a plurality of layers.

The third conductive layer CDL3 may be disposed on the first interlayer dielectric layer 1500. The third conductive layer CDL3 may include the source electrode and the drain electrode of each of the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7. For example, the third conductive layer CDL3 may include the fourth source electrode S4 of the fourth thin-film transistor ST4 as shown in FIG. 4, and may include the fifth source electrode S5 and the fifth drain electrode D5 of the fifth transistor as shown in FIG. 6.

When the third conductive layer CDL3 is disposed so that the source electrode and the drain electrode are formed on the first interlayer dielectric layer 1500, the first thin-film transistor ST1, the second thin-film transistor ST2, the third thin-film transistor ST3, the fourth thin-film transistor ST4, the fifth thin-film transistor ST5, the sixth thin-film transistor ST6 and the seventh thin-film transistor ST7 may be defined. The fourth source electrode S4 may be electrically connected to the fourth and fifth source/drain regions of the fourth and fifth semiconductor patterns ACT4 and ACT5 through contact holes formed through the first interlayer dielectric layer 1500, the second gate insulating layer 1400 and the first gate insulating layer 1300.

The third conductive layer CDL3 may include a metal. For example, the third conductive layer CDL3 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The first via insulating layer 1600 can partially insulate the third conductive layer CDL3 from the fourth conductive layer CDL4 to be described later. In the display area DA, the third conductive layer CDL3 may be disposed on the first interlayer dielectric layer 1500. The first via insulating layer 1600 may be formed using an organic insulating material such as an acrylic resin, a polyimide-based resin, and a polyamide-based resin.

The fourth conductive layer CDL4 may be disposed on the first via insulating layer 1600. The fourth conductive layer CDL4 may include a connection electrode electrically connected to the source electrode or the drain electrode of the first to seventh thin-film transistors ST7, the initialization voltage line VIL, etc. For example, the fourth conductive layer CDL4 may include the initialization voltage line VIL electrically connected to the fourth source electrode S4 as shown in FIG. 4, and may include a fifth connection electrode CNE5 electrically connected to the fifth drain electrode D5 as shown in FIG. 6. The fifth connection electrode CNE5 may be electrically connected to the fifth drain electrode D5 through a contact hole formed through the first via insulating layer 1600.

The fourth conductive layer CDL4 may include a metal. For example, the fourth conductive layer CDL4 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second via insulating layer 1700 may be disposed on the first via insulating layer 1600 on which the fourth conductive layer CDL4 is formed in the display area DA. Like the first via insulating layer 1600, the second via insulating layer 1700 may be formed using an organic insulating material such as an acrylic resin, a polyimide-based resin, and a polyamide-based resin.

As described above, the light-emitting element LEL may include the first electrode 1910, the emissive layer 1930 and the second electrode 1950, and may be disposed on the second via insulating layer 1700.

The first electrode 1910 of the light-emitting element LEL may be an anode electrode, and as shown in FIG. 6, may be electrically connected to the fifth connection electrode CNE5 through a contact hole formed through the second via insulating layer 1700, to be electrically connected to the fifth drain electrode D5 of the fifth thin-film transistor ST5.

A pixel-defining film 1800 may be disposed on the second via insulating layer 1700 on which the first electrode 1910 is disposed. The pixel-defining film 1800 may be formed using an organic material, etc. The pixel-defining film 1800 may form an opening partially exposing the first electrode 1910.

The emissive layer 1930 may be disposed on the first electrode 1910 and the pixel-defining film 1800. When the emissive layer 1930 is an organic emissive layer including an organic material, the light-emitting element LEL may be an organic light-emitting diode. When the emissive layer 1930 includes a quantum-dot emissive layer, the light-emitting element LEL may be a quantum-dot light emitting device. When the emissive layer 1930 includes an inorganic semiconductor, the light-emitting element LEL may be an inorganic light-emitting device. Alternatively, the light-emitting element EL may be a micro light-emitting diode.

The second electrode 1950 may be disposed on the emissive layer 1930. The second electrode 1950 may have substantially the same profile as the emissive layer 1930.

The thin-film encapsulation layer 2000 can prevent external moisture and oxygen from permeating into the sub-pixel SP. The thin-film encapsulation layer 2000 may be disposed on the second electrode 1950 of the light-emitting element LEL.

The thin-film encapsulation layer 2000 may include at least one organic layer 2300 and at least one inorganic layer in the display area DA. At least one organic layer 2300 and at least one inorganic layer may be stacked on one another alternately. For example, as shown in FIG. 4, the thin-film encapsulation layer 2000 may include a first inorganic layer 2100, an organic layer 2300 and a second inorganic layer 2500, and the organic layer 2300 may be disposed between a first inorganic layer 2100 and a second inorganic layer 2500. It should be understood, however, that the disclosure is not limited thereto.

The touch layer 3000 may sense a contact input applied to the display device 1. The touch layer 3000 may be disposed on the thin-film encapsulation layer 2000. The touch layer 3000 may include a touch protection layer and one or more conductive layers and insulating layers. The conductive layers and insulating layers may be stacked on one another alternately. The touch protection layer may be disposed on the second touch conductive layer. The touch protection layer may be an organic film.

In general, among the insulating layers like the first gate insulating layer 1300 and the second gate insulating layer 1400, an insulating layer containing silicon nitride has a higher hydrogen ion concentration than an insulating layer containing silicon oxide. This is because the material gas when the insulating layer containing silicon oxide is formed by the chemical vapor deposition is different from the material gas when the insulating layer containing silicon nitride is formed by the chemical vapor deposition. More specifically, ammonium gas is used as one of the material gases used to form the insulating layer containing silicon nitride by the chemical vapor deposition. Such ammonium gas may increase the hydrogen ion concentration of the insulating layer containing silicon nitride. On the other hand, ammonium gas may not be used in forming the insulating layer containing silicon oxide.

Hydrogen ions of the insulating layer containing silicon nitride may diffuse into the semiconductor layer ACTL disposed thereunder. When this happens, the hydrogen ions may diffuse into the semiconductor layer ACTL, so that defects in the semiconductor layer ACTL may be reduced. As defects in the semiconductor layer ACTL are reduced, a leakage current may be reduced while the thin-film transistor is driven. In addition, as defects in the semiconductor layer ACTL are reduced, the driving range of the thin-film transistor may also be reduced. The driving range of a thin-film transistor may refer to the range of a gate voltage applied to the gate electrode of the thin-film transistor. If the driving range of the first thin-film transistor ST1 is reduced, the screen output of the display device 1 may become incomplete. Therefore, the driving range of the first thin-film transistor ST1 is required to be greater than the driving ranges of the second thin-film transistor ST2, the third thin-film transistor ST3, the fourth thin-film transistor ST4, the fifth thin-film transistor ST5, the sixth thin-film transistor ST6 and the seventh thin-film transistor ST7. The driving range of a thin-film transistor may increase as the thickness of the first gate insulating layer 1300 between the semiconductor layer ACTL and the first conductive layer CDL1 increases.

Accordingly, by selectively adjusting the thickness of the first gate insulating layer 1300, the driving range of the first thin-film transistor ST1 can be greater than the driving ranges of the second thin-film transistor ST2, the third thin-film transistor ST3, the fourth thin-film transistor ST4, the fifth thin-film transistor ST5, the sixth thin-film transistor ST6, and the seventh thin-film transistor ST7. Specifically, a part of the first gate insulating layer 1300 which overlaps with the first thin-film transistor ST1 in the third direction DR3 may be thicker than the other part of the first gate insulating layer 1300 which overlaps with the second thin-film transistor ST2, the third thin-film transistor ST3, the fourth thin-film transistor ST4, the fifth thin-film transistor ST5, the sixth thin-film transistor ST6, and the seventh thin-film transistor ST7. By doing so, the driving range of the first thin-film transistor ST1 can be greater than the driving ranges of the second thin-film transistor ST2, the third thin-film transistor ST3, the fourth thin-film transistor ST4, the fifth thin-film transistor ST5, the sixth thin-film transistor ST6, and the seventh thin-film transistor ST7.

Referring to FIGS. 5 and 7, the first gate insulating layer 1300 may include a first insulating layer 1310, a second insulating layer 1330, and a third insulating layer 1350. The second insulating layer 1330 may be disposed on the first insulating layer 1310, and the third insulating layer 1350 may be disposed on the second insulating layer 1330. The first gate insulating layer 1300 may partially include the third insulating layer 1350. In this instance, the second insulating layer 1330 may be disposed between the third insulating layer 1350 and the first insulating layer 1310. Specifically, the first gate insulating layer 1300 may include the first insulating layer 1310, the second insulating layer 1330 and the third insulating layer 1350 where it overlaps with the first thin-film transistor ST1 in the third direction DR3, while it may include the first insulating layer 1310 and the second insulating layer 1330 where it overlaps with the fourth thin-film transistor ST4 and the fifth thin-film transistor ST5 in the third direction DR3. In other words, the first gate insulating layer 1300 on the fourth semiconductor pattern layer ACT4 and the fifth semiconductor pattern layer ACT5 further includes the third insulating layer 1350 compared to the first gate insulating layer 1300 on the first semiconductor pattern layer ACT1, the width of the first gate insulating layer 1300 on the fourth semiconductor pattern layer ACT4 and the fifth semiconductor pattern layer ACT5 in the third direction DR3 (hereinafter referred to as thickness) may be smaller than the thickness of the first gate insulating layer 1300 on the first semiconductor pattern layer ACT1.

According to the above configuration, in the display device 1 according to the embodiment, the driving range of the first thin-film transistor ST1 is greater than the driving ranges of the second thin-film transistor ST2, the third thin-film transistor ST3, the fourth thin-film transistor ST4, the fifth thin-film transistor ST5, the sixth thin-film transistor ST6 and the seventh thin-film transistor ST7. In addition, leakage currents in second thin-film transistor ST2, the third thin-film transistor ST3, the fourth thin-film transistor ST4, the fifth thin-film transistor ST5, the sixth thin-film transistor ST6 and the seventh thin-film transistor ST7 can be relatively reduced.

The first insulating layer 1310, the second insulating layer 1330 the third insulating layer 1350 of the first gate insulating layer 1300 will be described in detail with reference to FIGS. 8 and 9.

Figure 8:
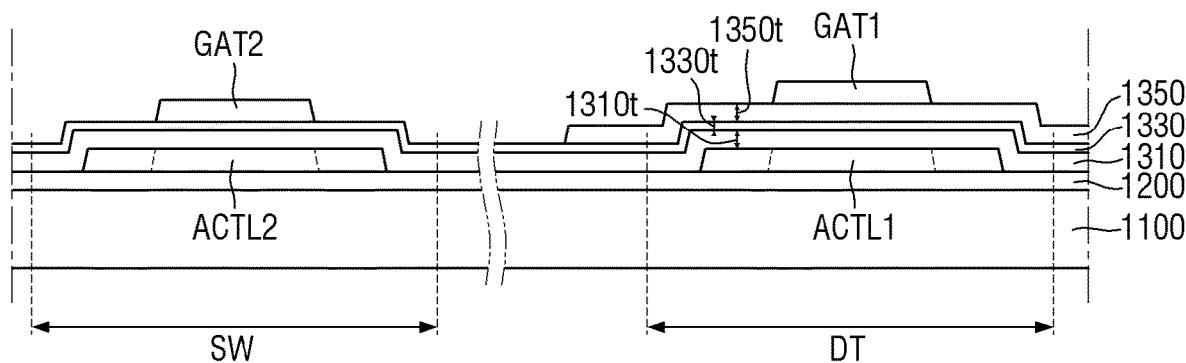
FIG. 8 is a structural diagram showing a structure of a first gate insulating layer on a driving transistor and a switching transistor.
Figure 8:
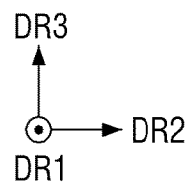

FIG. 8 is a structural diagram showing a structure of a first gate insulating layer on a driving transistor and a switching transistor. FIG. 9 is a graph showing the bandgap energy versus the dielectric constant of the high-k material.

Referring to FIG. 8, the first gate insulating layer 1300 may include a first insulating layer 1310, a second insulating layer 1330, and a third insulating layer 1350. The second insulating layer 1330 may be disposed on the first insulating layer 1310, and the third insulating layer 1350 may be disposed on the second insulating layer 1330. The first gate insulating layer 1300 may partially include the third insulating layer 1350. In this instance, the second insulating layer 1330 may be disposed between the third insulating layer 1350 and the first insulating layer 1310. Specifically, the first gate insulating layer 1300 may include the first insulating layer 1310, the second insulating layer 1330 and the third insulating layer 1350 where it overlaps the driving transistor DT in the third direction DR3, while it may include the first insulating layer 1310 and the second insulating layer 1330 where it overlaps the switching transistor SW in the third direction DR3. In other words, since the first gate insulating layer 1300 on the first area ACTL1 of the semiconductor layer ACTL further includes the third insulating layer 1350 compared to the first gate insulating layer 1300 on the second area ACTL2 of the semiconductor layer ACTL, the thickness of the first gate insulating layer 1300 on the second area ACTL2 of the semiconductor layer ACTL may be smaller than the thickness of the first gate insulating layer 1300 on the first area ACTL1 of the semiconductor layer ACTL.

As described above, the switching transistors SW may include a first switching transistor SW1 and a second switching transistor SW2. The first switching transistor SW1 may include the second thin-film transistor ST2, the third thin-film transistor ST3 and the fourth thin-film transistor ST4, and the second switching transistor SW2 may include the fifth thin-film transistor ST5, the sixth thin-film transistor ST6 and the seventh thin-film transistor ST7.

The first insulating layer 1310 may be disposed on the buffer layer 1200 on which the semiconductor layer ACTL is disposed to cover the semiconductor layer ACTL. The first insulating layer 1310 may cover both the first area ACTL1 and the second area ACTL2 of the semiconductor layer ACTL. One side of the first insulating layer 1310 in the third direction DR3 may be the upper surface on which the second insulating layer 1330 is disposed, and the opposite side of the first insulating layer 1310 in the third direction DR3 may be the lower surface on which the buffer layer 1200 or the semiconductor layer ACTL is disposed. The first insulating layer 1310 may be disposed to have substantially the same width in the third direction DR3 (hereinafter referred to as thickness) along the profile of the semiconductor layer ACTL. In some embodiments, the first insulating layer 1310 may include, but is not limited to, silicon oxide. For example, the first insulating layer 1310 may have a multilayer structure including silicon oxide and silicon nitride.

The thickness 1310t of the first insulating layer 1310 may be, but is not limited to, approximately 600 Å to 1,200 Å. If the thickness 1310t of the first insulating layer 1310 is less than 600 Å, the amount of hydrogen flowing into the first area ACTL1 of the semiconductor layer ACTL through the first insulating layer 1310 may be excessive. If the thickness 1310t of the first insulating layer 1310 is greater than 1,200 Å, the amount of hydrogen flowing into the first area ACTL1 of the semiconductor layer ACTL through the first insulating layer 1310 may not be sufficient.

The third insulating layer 1350 may selectively adjust the thickness of the first gate insulating layer 1300. The third insulating layer 1350 may be disposed on the second insulating layer 1330 to selectively cover the second insulating layer 1330. One surface of the third insulating layer 1350 in the third direction DR3 may be the upper surface on which the first conductive layer CDL1 is disposed, and the opposite surface of the third insulating layer 1350 in the third direction DR3 may be the lower surface on which the second insulating layer 1330 is disposed. The third insulating layer 1350 may be a residue remaining after being selectively etched in the process of fabricating the display device 1 according to an embodiment to be described later. The third insulating layer 1350 may be selectively disposed to have substantially the same width in the third direction DR3 (hereinafter referred to as thickness) along the profile of the second insulating layer 1330. In some embodiments, the third insulating layer 1350 may include, but is not limited to, silicon nitride. For example, the third insulating layer 1350 may include silicon oxide or may include a plurality of layers made of silicon nitride and silicon oxide.

According to an embodiment of the disclosure, the thickness 1350t of the third insulating layer 1350 may be, but is not limited to, 450 Å to 1200 Å.

The second insulating layer 1330 may be disposed on the first insulating layer 1310 to cover the first insulating layer 1310. One surface of the second insulating layer 1330 in the third direction DR3 may be the upper surface on which the third insulating layer 1350 is disposed, and the opposite surface of the first insulating layer 1350 in the third direction DR3 may be the lower surface on which the first insulating layer 1310 is disposed. The second insulating layer 1330 may be disposed to have substantially the same width in the third direction DR3 (hereinafter referred to as thickness) along the profile of the first insulating layer 1310.

According to an embodiment of the disclosure, the thickness 1330t of the second insulating layer 1330 may be, but is not limited to, 100 Å to 300 Å. When the thickness 1330t of the second insulating layer 1330 ranges from 100 Å to 300 Å, it is possible to prevent generation of a leakage current due to tunneling effect, as will be described later.

The second insulating layer 1330 can work as an etch stopper which prevents the first insulating layer 1310 from being etched during selective dry etching of the third insulating layer 1350 (see FIG. 16) in the process of fabricating the display device 1 according to the embodiment of the disclosure to be described later, thereby stabilizing the device characteristics of the thin-film transistor.

If the third insulating layer 1350 is disposed on the first insulating layer 1310 without the second insulating layer 1330 and the third insulating layer 1350 is selectively dry-etched to adjust the thickness of the first gate insulating layer 1300, a part of the first insulating layer 1310 may be etched as well when the third insulating layer 1350 is etched because the etch selectivity between the third insulating layer 1350 and the first insulating layer 1310 is low. When this happens, as a part of the first insulating layer 1310 is etched, and thus the device characteristics of the thin-film transistor may be changed. Specifically, if a part of the first insulating layer 1310 is etched, the device characteristics of the thin-film transistor such as the threshold voltage, the driving range, the drain-induced barrier lowering (DIBL), and driving current may be changed, and thus the reliability may be deteriorated.

Therefore, by disposing the second insulating layer 1330 between the first insulating layer 1310 and the third insulating layer 1350 as an etch stopper to prevent a part of the first insulating layer 1310 from being etched, device characteristics of the thin-film transistor can be stabilized.

The second insulating layer 1330 may include a material that has an interatomic bonding energy greater than the interatomic bonding energy of the material included in the third insulating layer 1350 and has a higher dielectric constant than the dielectric constant of silicon oxide. For example, the second insulating layer 1330 may include, but is not limited to, one of aluminum oxide ($Al_2O_3$), zirconium oxide ($ZrO_2$), hafnium oxide ($HfO_2$), yttrium oxide ($Y_2O_3$), tantalum pentoxide ($Ta_2O_5$), and cerium oxide ($CeO_2$).

In the selective dry etching of the third insulating layer 1350 during the process of fabricating the display device 1 according to an embodiment, the etch selectivity between the third insulating layer 1350 and the second insulating layer 1330 may be 1.5 or more. In other words, when the third insulating layer 1350 is selectively etched, the second insulating layer 1330 disposed on the lower surface of the third insulating layer 1350 may also be partially etched. When the etch selectivity between the third insulating layer 1350 and the second insulating layer 1330 is 1.5, the rate at which the third insulating layer 1350 is etched may be 1.5 times the rate at which the second insulating layer 1330 is etched.

When the etch selectivity between the third insulating layer 1350 and the second insulating layer 1330 is 1.5 or more, the interatomic bonding energy of the material included in the third insulating layer 1350 may be weaker than the interatomic bonding energy of the material included in the second insulating layer 1330. For example, when the third insulating layer 1350 contains silicon nitride and the second insulating layer 1330 contains zirconium oxide, the etch selectivity between the third insulating layer 1350 and the second insulating layer 1330 ($SiN_x/ZrO_2$) is 3.89. The interatomic bonding energy of silicon nitride, i.e., the bonding energy between silicon and nitrogen (Si—N bonding energy) may be weaker than the interatomic bonding energy of zirconium oxide, i.e., the bonding energy between zirconium and oxygen (Zr—O binding energy). Accordingly, the second insulating layer 1330 may be less etched than the third insulating layer 1350.

Accordingly, when the third insulating layer 1350 is etched, the second insulating layer 1330 is minimally etched and the first insulating layer 1310 is not etched by the second insulating layer 1330, so that the device characteristics of the thin-film transistors are not changed, and thus the stability of the device characteristics of the thin-film transistors can be ensured.

Figure 9:
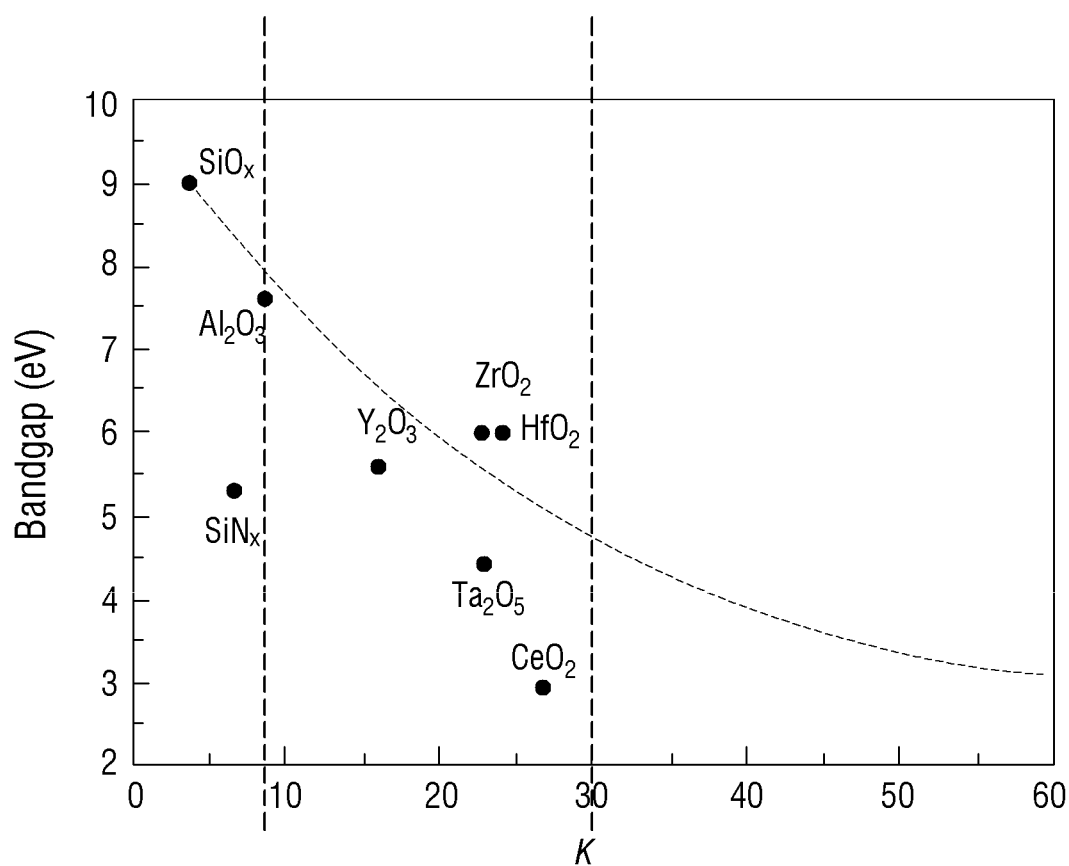
FIG. 9 is a graph showing bandgap energy versus dielectric constant of high-k material.

Referring to FIG. 9, the second insulating layer 1330 may include a high-k material having a high dielectric constant. The high-k material may refer to a material having a higher dielectric constant than that of silicon oxide. In the graph of FIG. 9, the x-axis may represent the dielectric constant, and the y-axis may represent the band-gap energy.

The dielectric constant of the second insulating layer 1330 may be greater than the dielectric constant of the first insulating layer 1310 and the dielectric constant of the third insulating layer 1350. The dielectric constant of the second insulating layer 1330 may be in the range of 8 to 30. If the dielectric constant of the second insulating layer 1330 is less than 8, the second insulating layer 1330 may become too thin in order to achieve the capacitance of the first gate insulating layer 1300. If the second insulating layer 1330 is too thin, a leakage current may occur due to tunneling effect, and thus the second insulating layer 1330 may fail to work as an insulator. If the dielectric constant of the second insulating layer 1330 is greater than 30, the second insulating layer 1330 may be easily polarized to allow the electrons to move more easily, and thus the second insulating layer 1330 may fail to work as an insulator.

The thickness of the first gate insulating layer 1300 may be defined as the sum of the thickness 1310t of the first insulating layer 1310, the thickness 1330t of the second insulating layer 1330 and the thickness 1350t of the third insulating layer 1350. As used herein, an equivalent oxide thickness (EOT) may refer to the thickness of $SiO_2$ needed to obtain the same electric performance as obtained with a thicker high-k dielectric material. Therefore, the thickness of the first gate insulating layer 1300 may be different from the equivalent oxide thickness (EOT) of the first gate insulating layer 1300.

The equivalent oxide thickness can be obtained from Equation 2 below:

$$T_{EOT} = \frac{K_{ox}}{K_{high\_K}} Y_{high\_K} + T_{if\_ox} \qquad \text{[Equation 2]}$$

where TEOT denotes the equivalent oxide thickness, Kox denotes the dielectric constant of silicon oxide, $K_{high\_K}$ denotes the dielectric constant of a high-k material, $T_{high\_K}$ denotes the thickness of the high-k material, and $T_{if\_ox}$ denotes the thickness of silicon oxide.

The first gate insulating layer 1300 may have an equivalent oxide thickness (EOT) within a predetermined range depending on the type of the thin-film transistors. For example, in the switching transistors SW, the equivalent oxide thickness of the first gate insulating layer 1300 may range from 1,000 Å to 1,500 Å. In the driving transistors DT, the equivalent oxide thickness of the first gate insulating layer 1300 may range from 1,250 Å to 1,750 Å. It should be understood, however, that the disclosure is not limited thereto. The equivalent oxide thickness of the first gate insulating layer 1300 in the driving transistor DT may be larger than the equivalent oxide thickness of the first gate insulating layer 1300 in the switching transistor SW by 250 Å to 300 Å.

The thickness 1350t of the third insulating layer 1350 may vary depending on the range of the equivalent oxide thickness of the first gate insulating layer 1300, the range of the thickness 1310t of the first insulating layer 1310, and the range of the thickness 1330t of the second insulating layer 1330. In other words, the range of the thickness 1350t of the third insulating layer 1350 may be defined on the conditions that the equivalent oxide thickness of the first gate insulating layer 1300 ranges from 1,000 Å to 1,500 Å in the switching transistor SW and ranges from 1,250 Å to 1,750 Å in the driving transistor DT, the thickness 1310t of the first insulating layer 1310 ranges from 600 Å to 1,200 Å, and the thickness 1330t of the second insulating layer 1330 ranges from 100 Å to 300 Å. For example, when the first insulating layer 1310 includes silicon oxide having the thickness of 900 Å, the second insulating layer 1330 includes aluminum oxide having the thickness of 300 Å (dielectric constant $K_{high\_K}$=8), and the third insulating layer 1350 includes silicon nitride having the thickness of 450 Å (dielectric constant $K_{high\_K}$=7), the equivalent oxide thickness of the first gate insulating layer 1300 may be 1,297 Å in the driving transistor DT and 1,046 Å in the switching transistor SW. It should be noted that the thickness of the first gate insulating layer 1300 may be different from the equivalent oxide thickness of the first gate insulating layer 1300. In the above example, in the driving transistor DT, the equivalent oxide thickness of the first gate insulating layer 1300 may be 1,297 Å, and the thickness of the first gate insulating layer 1300 may be 1,650 Å.

According to the above configuration, in the display device 1 according to the embodiment, the driving range of the driving transistor DT can be greater than the driving range of the switching transistor SW and the leakage current of the switching transistor SW can be reduced while ensuring the stability of device characteristics of the thin-film transistor.

Hereinafter, a method of fabricating a display device 1 according to an embodiment of the disclosure will be described.

Figure 10:
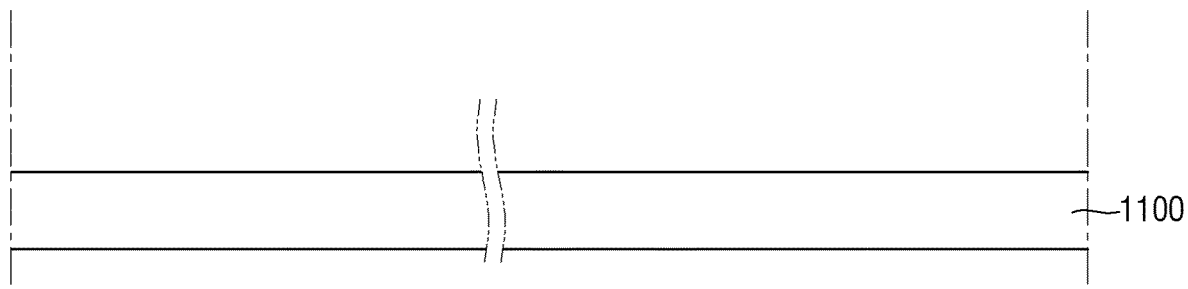
FIG. 10 is a view schematically showing a processing step of preparing a substrate during a process of fabricating a display device according to an embodiment.
Figure 11:
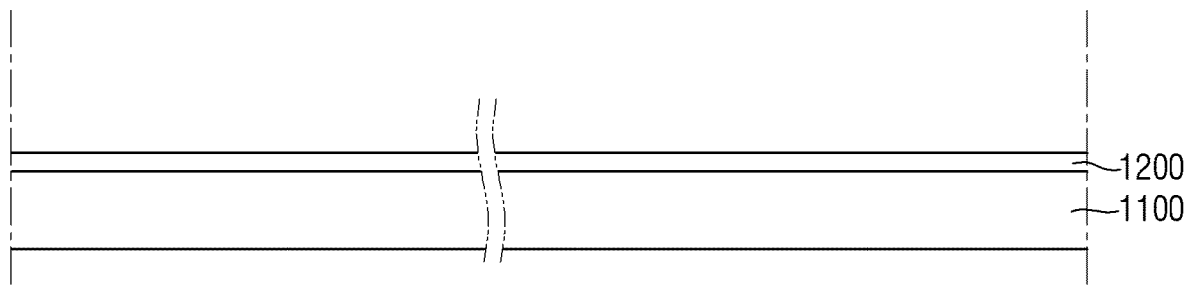
FIG. 11 is a view schematically showing a process of disposing a buffer layer on the substrate of FIG. 10.
Figure 11:
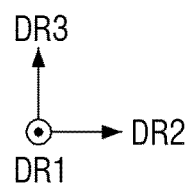
Figure 12:
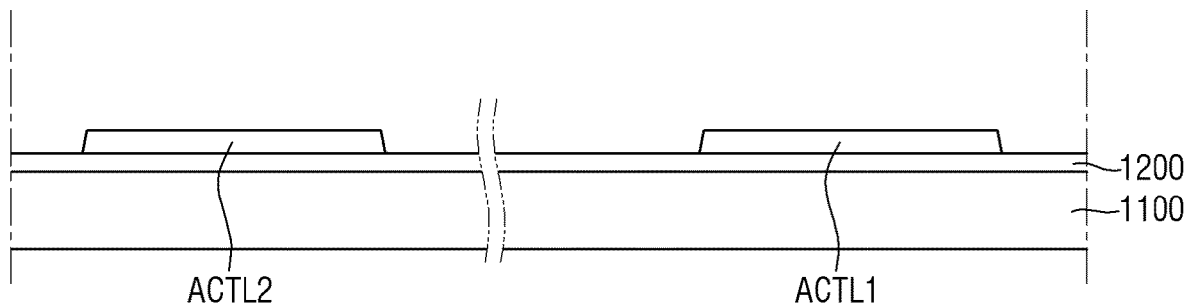
FIG. 12 is a view schematically showing a process of disposing a semiconductor layer.
Figure 12:
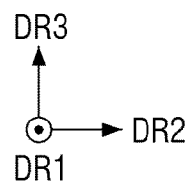
Figure 13:
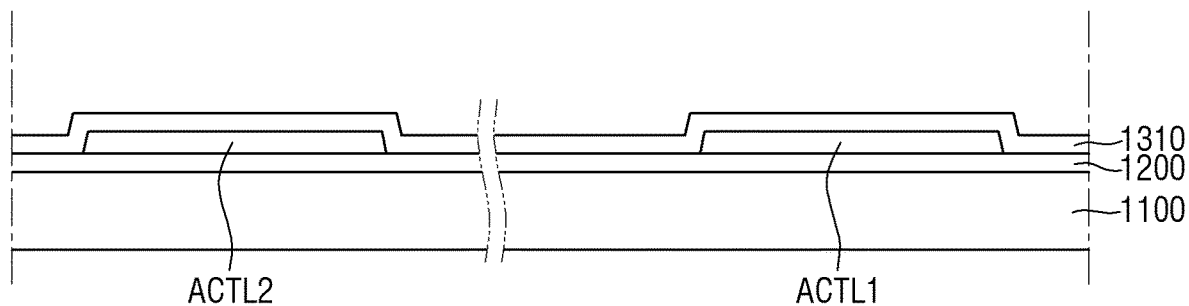
FIG. 13 is a view schematically showing a process of disposing a first insulating layer of a first gate insulating layer.
Figure 14:
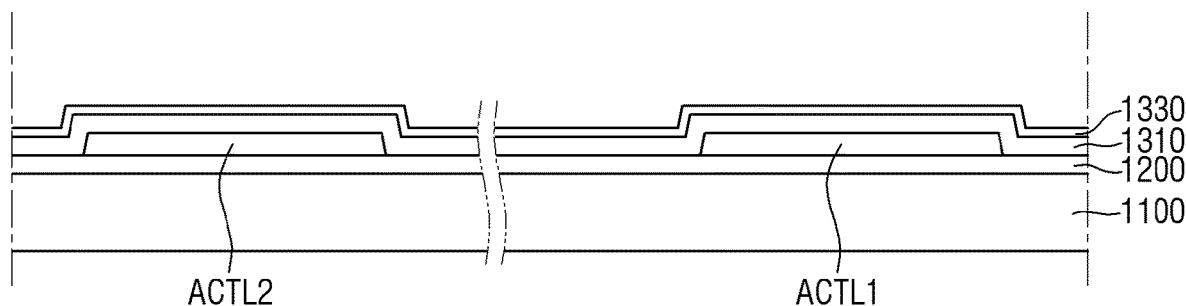
FIG. 14 is a view schematically showing a process of disposing a second insulating layer of a first gate insulating layer.
Figure 14:
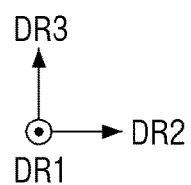
Figure 15:
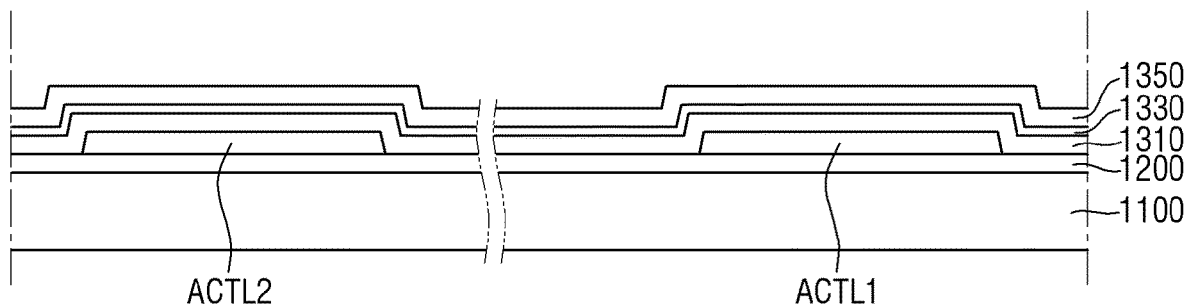
FIG. 15 is a view schematically showing a process of disposing a third insulating layer of a first gate insulating layer.
Figure 15:
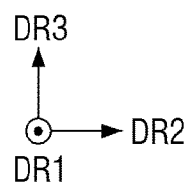
Figure 16:
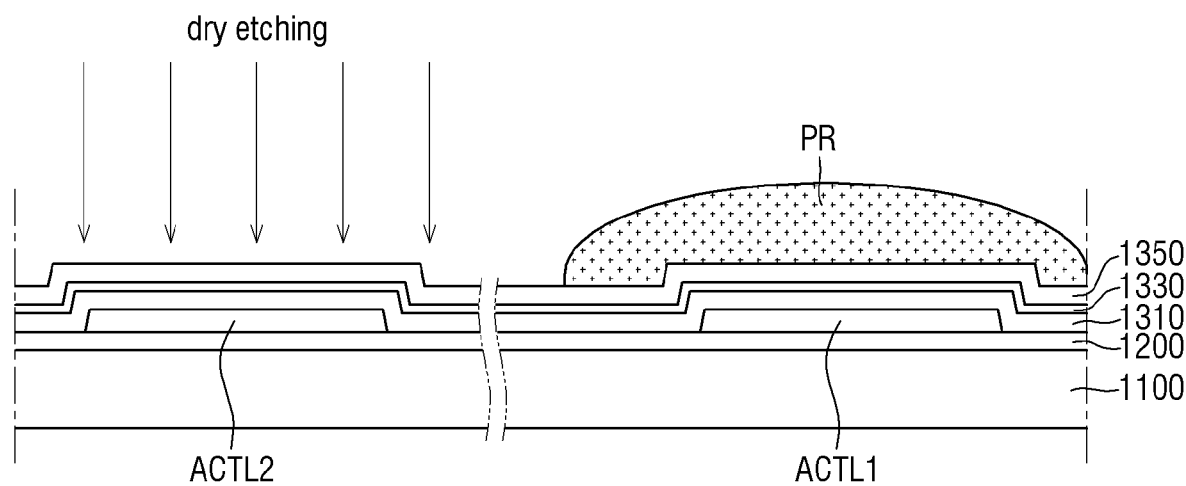
FIGS. 16 and 17 are views schematically showing a process of selectively etching the third insulating layer.
Figure 16:
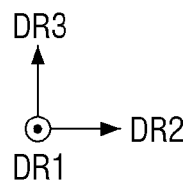
Figure 17:
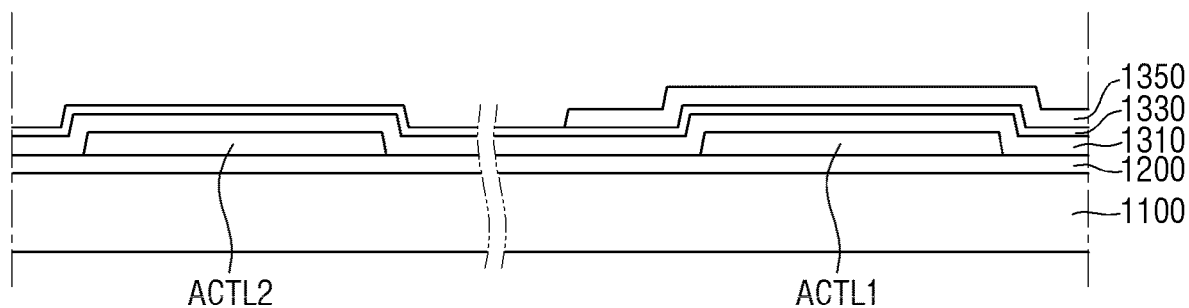

FIG. 10 is a view schematically showing a processing step of preparing a substrate during a process of fabricating a display device according to an embodiment. FIG. 11 is a view schematically showing a process of disposing a buffer layer on the substrate of FIG. 10. FIG. 12 is a view schematically showing a process of disposing a semiconductor layer. FIG. 13 is a view schematically showing a process of disposing a first insulating layer of a first gate insulating layer. FIG. 14 is a view schematically showing a process of disposing a second insulating layer of a first gate insulating layer. FIG. 15 is a view schematically showing a process of disposing a third insulating layer of a first gate insulating layer. FIGS. 16 and 17 are views schematically showing a process of selectively etching the third insulating layer.

Initially, referring to FIGS. 10 and 11, a substrate 1100 is prepared, and a buffer layer 1200 is formed on the substrate 1100. The specific process of forming the buffer layer 1200 is well known in the art; and, therefore, will not be described herein.

Subsequently, referring to FIG. 12, a semiconductor layer ACTL is formed on the buffer layer 1200. For example, the semiconductor layer ACTL may be formed by forming an amorphous silicon layer on the buffer layer 1200, crystallizing the amorphous silicon layer to form a polycrystalline silicon layer, and then patterning the polycrystalline silicon layer. The semiconductor layer ACTL may include the first area ACTL1 and the second area ACTL2 as described above. Examples of the crystallizing techniques may include, but is not limited to, rapid thermal annealing (RTA), solid phase crystallization (SPC), excimer laser annealing (ELA), metal induced crystallization (MIC), metal induced lateral crystallization (MILC), sequential lateral solidification (SLS), etc.

Subsequently, referring to FIGS. 13 to 15, the first insulating layer 1310, the second insulating layer 1330 and the third insulating layer 1350 are sequentially formed on the buffer layer 1200 on which the semiconductor layer ACTL is formed. The semiconductor layer ACTL may include the first area ACTL1 and the second area ACTL2 as described above. For example, the first insulating layer 1310 may be formed on the buffer layer 1200 on which the semiconductor layer ACTL is formed, the second insulating layer 1330 may be formed on the first insulating layer 1310, and then the third insulating layer 1350 may be formed on the second insulating layer 1330. The third insulating layer 1350 may be disposed to have substantially the same thickness along the profile of the second insulating layer 1330, and may completely cover the second insulating layer 1330.

Subsequently, referring to FIGS. 16 and 17, a photosensitive organic material is applied onto the third insulating layer 1350, and it is exposed to light and developed to form a photoresist layer PR on a part of the third insulating layer 1350 overlapping the first area ACTL1 of the semiconductor layer ACTL in the third direction DR3. Then, the part of the third insulating layer 1350 overlapping the second area ACTL2 of the semiconductor layer ACTL is selectively etched by using the photoresist layer PR as an etch stop layer. For example, the process of selectively etching the third insulating layer 1350 may be performed by dry etching. The dry etching may be performed using carbon tetrafluoride (CF4) and $O_2$ plasma or a fluorine-based compound and $O_2$ plasma.

If the third insulating layer 1350 is disposed on the first insulating layer 1310 without the second insulating layer 1330 and the third insulating layer 1350 is selectively dry-etched to adjust the thickness of the first gate insulating layer 1300, a part of the first insulating layer 1310 may be etched as well when the third insulating layer 1350 is etched because the etch selectivity between the third insulating layer 1350 and the first insulating layer 1310 is low. Therefore, by disposing the second insulating layer 1330 between the first insulating layer 1310 and the third insulating layer 1350 as an etch stopper to prevent a part of the first insulating layer 1310 from being etched, device characteristics of the thin-film transistor can be stabilized.

The photoresist layer PR may not be formed on a part of the third insulating layer 1350 which overlaps with the second area ACTL2 of the semiconductor layer ACTL in the third direction DR3. In other words, the photoresist layer PR may not overlap with the second area ACTL2 of the semiconductor layer ACTL in the third direction DR3 but may expose the part of the third insulating layer 1350 which overlaps with the second area ACTL2 of the semiconductor layer ACTL.

The photoresist layer PR and the part of the third insulating layer 1350 overlapping the second area ACTL2 of the semiconductor layer ACTL in the third direction DR3 may be removed by dry etching, while the part of the third insulating layer 1350 overlapping with the first area ACTL1 of the semiconductor layer ACTL in the third direction DR3 may remain. In other words, the third insulating layer 1350 may be a residue left after the dry etching. As described above, when the etch selectivity between the third insulating layer 1350 and the second insulating layer 1330 is 1.5 or more, the second insulating layer 1330 may not be substantially etched during the process of etching the third insulating layer 1350. If the photoresist layer PR is not completely removed by the dry etching, an additional process for removing the remaining photoresist layer PR may be carried out.

Subsequently, a first conductive layer CDL1 is formed on the third insulating layer 1350 and the second insulating layer 1330. As described above, the first conductive layer CDL1 may include a first gate pattern GAT1 and a second gate pattern GAT2. The first gate pattern GAT1 may overlap with the first area ACTL1 of the semiconductor layer ACTL in the third direction DR3. The second gate pattern GAT2 may overlap with the second area ACTL2 of the semiconductor layer ACTL in the third direction DR3. By forming the first conductive layer CDL1 on the third insulating layer 1350 and the second insulating layer 1330, the structure shown in FIG. 8 can be obtained.

According to the above-described method of fabricating the display device 1, the first insulating layer 1310 and the second insulating layer 1330 are substantially not etched, so that it is possible to fabricate the display device 1 in which the stability of device characteristics of the thin-film transistor can be ensured while the driving range of the driving transistor DT can be greater than the driving range of the switching transistor SW and the leakage current of the switching transistor SW can be reduced.

Hereinafter, a display device 1 according to other embodiments of the disclosure will be described. In the following description, the same or similar elements will be denoted by the same or similar reference numerals, and redundant descriptions will be omitted or briefly described.

Figure 18:
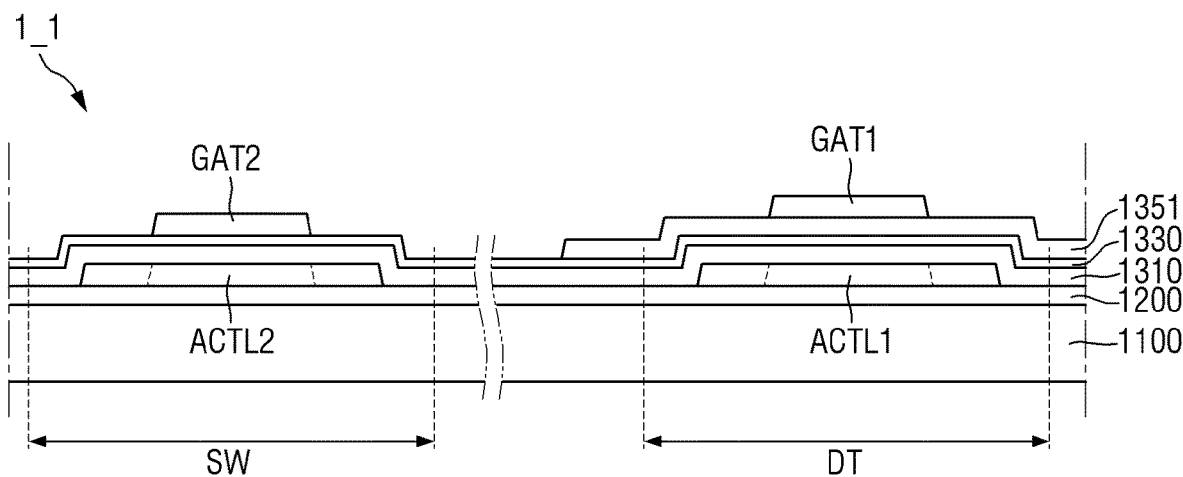
FIG. 18 is a structural diagram illustrating a structure of a first gate insulating layer above a driving transistor and a switching transistor in a display device according to another embodiment.

FIG. 18 is a structural diagram illustrating a structure of a first gate insulating layer on a driving transistor and a switching transistor in a display device according to another embodiment.

FIG. 18 shows an example where a third insulating layer 1351 of a display device 1_1 according to the embodiment may include silicon oxide. Specifically, a first gate insulating layer 1301 on a driving transistor DT may include a first insulating layer 1310 containing silicon oxide, a second insulating layer 1330 containing a high-k material, and a third insulating layer 1351 containing silicon oxide.

Figure 19:
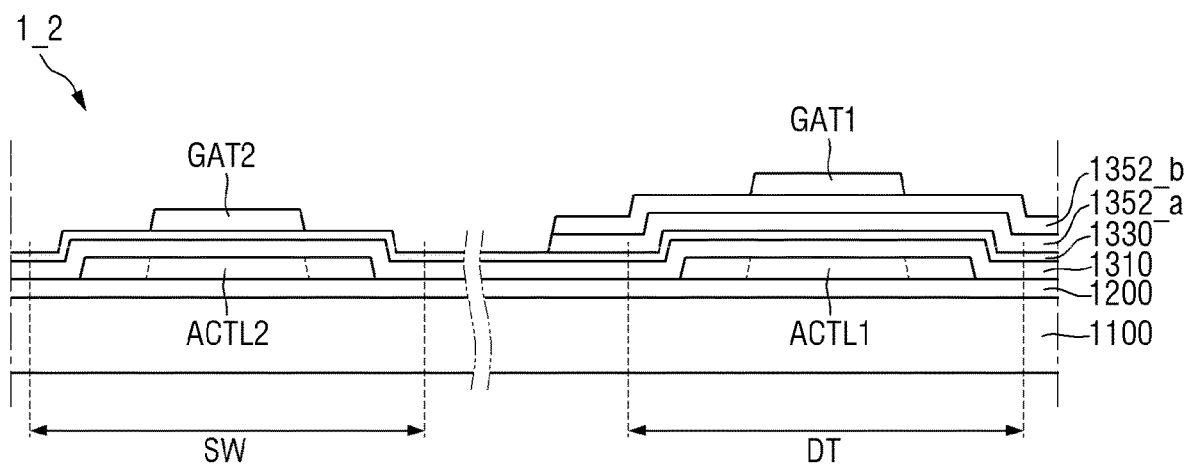
FIG. 19 is a structural diagram illustrating a structure of a first gate insulating layer above a driving transistor and a switching transistor in a display device according to yet another embodiment.

FIG. 19 is a structural diagram illustrating a structure of a first gate insulating layer on a driving transistor and a switching transistor in a display device according to yet another embodiment.

FIG. 19 shows an example where a third insulating layer 1352 of a display device 1_2 according to the embodiment may include a (3_1) insulating layer 1352_a and a (3_2) insulating layer 1352_b. Specifically, a first gate insulating layer 1302 on a driving transistor DT may include a first insulating layer 1310 containing silicon oxide, a second insulating layer 1330 contain a high-k material, the (3_1) insulating layer 1352_a disposed on the second insulating layer 1330, and the (3_2) insulating layer 1352_b disposed on the (3_1) insulating layer 1352_a. In other words, the third insulating layer 1352 may have a multilayer structure including the (3_1) insulating layer 1352_a and the (3_2) insulating layer 1352_b disposed on the (3_1) insulating layer 1352_a.

The dielectric constant of the second insulating layer 1330 may be greater than the dielectric constant of the (3_1) insulating layer 1352_a and the dielectric constant of the (3_2) insulating layer 1352_b.

In some embodiments, the (3_1) insulating layer 1352_a may include silicon oxide, and the (3_2) insulating layer 1352_b may include silicon nitride. It should be understood, however, that the disclosure is not limited thereto. For example, the (3_1) insulating layer 1352_a may include silicon nitride, and the (3_2) insulating layer 1352_b may include silicon oxide.

In some embodiments, the third insulating layer 1352 may include, but is not limited to, a double-layer structure. For example, the third insulating layer 1352 may have a triple-layer structure.

Figure 20:
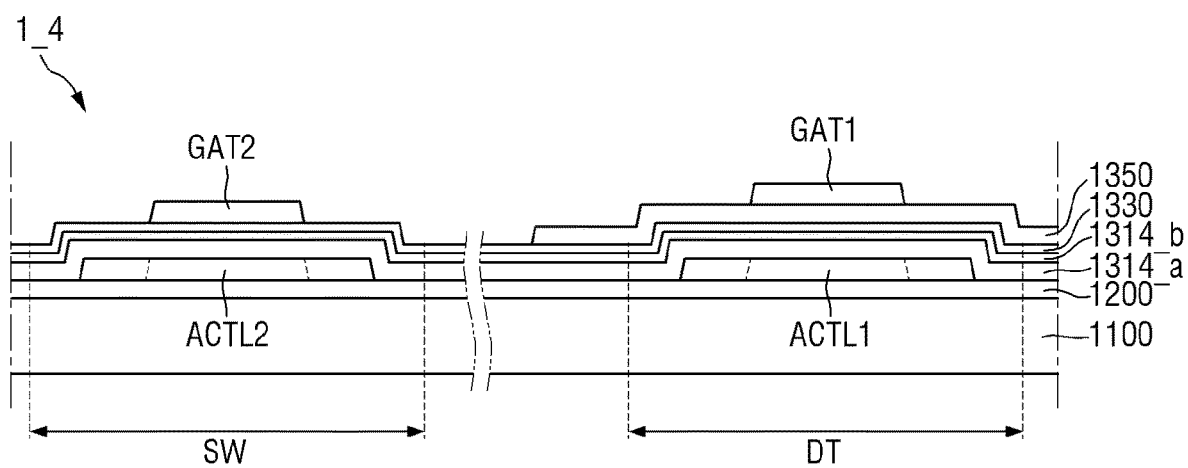
FIG. 20 is a structural diagram illustrating a structure of a first gate insulating layer above a driving transistor and a switching transistor in a display device according to yet another embodiment.
Figure 20:
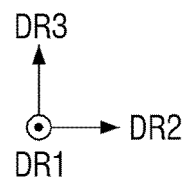

FIG. 20 is a structural diagram illustrating a structure of a first gate insulating layer on a driving transistor and a switching transistor in a display device according to yet another embodiment.

FIG. 20 shows an example where a first insulating layer 1314 of a display device 1_4 according to the embodiment may include a (1_1) insulating layer 1314_a and a (1_2) insulating layer 1314_b. Specifically, a first gate insulating layer 1304 on the driving transistor DT may include a (1_1) insulating layer 1314_a disposed on the semiconductor layer ACTL, a (1_2) insulating layer 1314_b disposed on the (1_1) insulating layer 1314_a, a second insulating layer 1330 disposed on the (1_2) insulating layer 1314_b and containing a high-k material, and a third insulating layer 1350 disposed on the second insulating layer 1330. In other words, the first insulating layer 1314 may have a multilayer structure including the (1_1) insulating layer 1314_a and the (1_2) insulating layer 1314_b disposed on the (1_1) insulating layer 1314_a.

The dielectric constant of the second insulating layer 1330 may be greater than the dielectric constant of the (1_1) insulating layer 1314_a and the dielectric constant of the (1_2) insulating layer 1314_b.

In some embodiments, the (1_1) insulating layer 1314_a may include silicon oxide, and the (1_2) insulating layer 1314_b may include silicon nitride. It should be understood, however, that the disclosure is not limited thereto.

Figure 21:
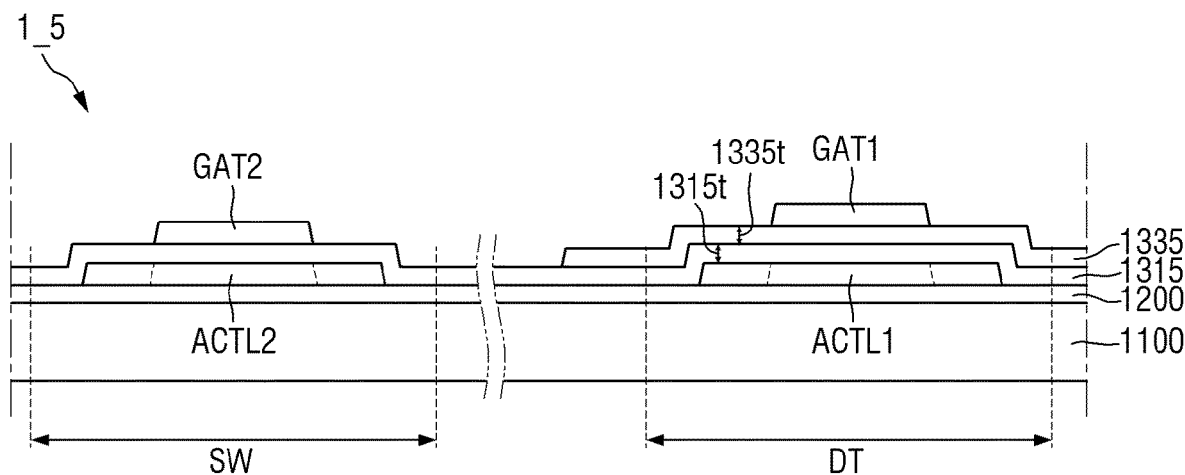
FIG. 21 is a structural diagram illustrating a structure of a first gate insulating layer above a driving transistor and a switching transistor in a display device according to yet another embodiment.

FIG. 21 is a structural diagram illustrating a structure of a first gate insulating layer on a driving transistor and a switching transistor in a display device according to yet another embodiment.

FIG. 21 shows an example where a first gate insulating layer 1305 of a display device 1_5 includes a first insulating layer 1315 containing a high-k material, and a second insulating layer 1335 partially disposed on the first insulating layer 1315. In other words, the first gate insulating layer 1305 of the display device 1_5 according to this embodiment is different from the first gate insulating layer 1300 of the display device 1 according to the embodiment of FIG. 8 in that the first insulating layer 1310 is eliminated. The first insulating layer 1315 according to this embodiment includes substantially the same material as the second insulating layer 1330 according to the embodiment of FIG. 8, and the second insulating layer 1335 according to this embodiment includes substantially the same material as the third insulating layer 1350 according to the embodiment of FIG. 8.

Specifically, the first insulating layer 1315 may be disposed on the buffer layer 1200 on which the semiconductor layer ACTL is disposed to cover the semiconductor layer ACTL. The first insulating layer 1315 may cover both the first area ACTL1 and the second area ACTL2 of the semiconductor layer ACTL. One side of the first insulating layer 1315 in the third direction DR3 may be the upper surface on which the second insulating layer 1335 is disposed, and the opposite side of the first insulating layer 1315 in the third direction DR3 may be the lower surface on which the buffer layer 1200 or the semiconductor layer ACTL is disposed. The first insulating layer 1315 may be disposed to have substantially the same width in the third direction DR3 (hereinafter referred to as thickness) along the profile of the semiconductor layer ACTL. The thickness 1,315$t$ of the first insulating layer 1315 may be, but is not limited to, approximately 2,060 Å to 3,070 Å.

The first insulating layer 1315 can work as an etch stopper which prevents the first area ACTL1 and the second area ACTL2 of the semiconductor layer ACTL from being etched together with the second insulating layer 1335 during selective dry etching of the second insulating layer 1335 (see FIG. 24) in the process of fabricating the display device 1_5 according to the embodiment of FIG. 21 to be described later, thereby stabilizing the device characteristics of the thin-film transistor.

The first insulating layer 1315 may include a material that has an interatomic bonding energy greater than the interatomic bonding energy of the material included in the second insulating layer 1335 and has a higher dielectric constant than the dielectric constant of silicon oxide and silicon nitride. In some embodiments, the first insulating layer 1315 may include, but is not limited to, one of aluminum oxide ($Al_2O_3$), zirconium oxide ($ZrO_2$), hafnium oxide ($HfO_2$), yttrium oxide ($Y_2O_3$), tantalum pentoxide ($Ta_2O_5$), and cerium oxide ($CeO_2$).

The dielectric constant of the first insulating layer 1315 may be greater than the dielectric constant of the second insulating layer 1335. The dielectric constant of the first insulating layer 1315 may be in the range of 8 to 30. The dielectric constant of the first insulating layer 1315 is substantially identical to that of the second insulating layer 1330 according to the embodiment of FIG. 8; and, therefore, the redundant descriptions will be omitted.

The second insulating layer 1335 may selectively adjust the thickness of the first gate insulating layer 1305. The second insulating layer 1335 may be disposed on the first insulating layer 1315 to selectively cover the first insulating layer 1315. One surface of the second insulating layer 1335 in the third direction DR3 may be the upper surface on which the first conductive layer CDL1 is disposed, and the opposite surface of the second insulating layer 1335 in the third direction DR3 may be the lower surface on which the first insulating layer 1315 is disposed. The second insulating layer 1335 may be a residue remaining after being selectively etched in the process of fabricating the display device 1_5 according to the embodiment of FIG. 21 to be described later. The second insulating layer 1335 may be selectively disposed to have substantially the same width in the third direction DR3 (hereinafter referred to as thickness) along the profile of the first insulating layer 1315. The thickness 1335$t$ of the second insulating layer 1335 may be, but is not limited to, approximately 450 Å to 1,330 Å.

In some embodiments, the second insulating layer 1335 may include, but is not limited to, silicon nitride. For example, the second insulating layer 1335 may include silicon oxide or may include a plurality of layers made of silicon nitride and silicon oxide.

The thickness of the first gate insulating layer 1305 may be defined as the sum of the thickness 1315$t$ of the first insulating layer 1315 and the thickness 1335$t$ of the second insulating layer 1335. The first gate insulating layer 1305 may have an equivalent oxide thickness within a predetermined range depending on the type of the thin-film transistor. For example, in the switching transistors SW, the equivalent oxide thickness of the first gate insulating layer 1300 may range from 1,000 Å to 1,500 Å. In the driving transistors DT, the equivalent oxide thickness of the first gate insulating layer 1305 may range from 1,250 Å to 1,750 Å. It should be understood, however, that the disclosure is not limited thereto. The equivalent oxide thickness of the first gate insulating layer 1305 in the driving transistor DT may be larger than the equivalent oxide thickness of the first gate insulating layer 1305 in the switching transistor SW by 250 Å to 300 Å. The equivalent oxide thickness can be obtained from Equation 2 above.

The thickness 1315$t$ of the first insulating layer 1315 and the thickness 1335$t$ of the second insulating layer 1335 may vary depending on the range of the equivalent oxide thickness of the first gate insulating layer 1305. In other words, the ranges of the thickness 1315$t$ of the first insulating layer 1315 and the thickness 1335$t$ to the second insulating layer 1335 may be defined on the conditions that the equivalent oxide thickness of the first gate insulating layer 1305 ranges from 1,000 Å to 1,500 Å in the switching transistor SW and ranges from 1,250 Å to 1,750 Å in the driving transistor DT. For example, when the first insulating layer 1315 includes aluminum oxide having the thickness of 2,060 Å (dielectric constant $K_{high\_K}$=8) and silicon nitride having the thickness of 450 Å (dielectric constant $K_{high\_K}$=7), the equivalent oxide thickness of the first gate insulating layer 1305 may be 1,255 Å in the driving transistor DT and 1004 Å in the switching transistor SW. It should be noted that the thickness of the first gate insulating layer 1305 may be different from the equivalent oxide thickness of the first gate insulating layer 1305. In the above example, in the driving transistor DT, the equivalent oxide thickness of the first gate insulating layer 1305 may be 1,255 Å, and the thickness of the first gate insulating layer 1305 may be 2,510 Å.

According to the above configuration, in the display device 1_5 according to the embodiment of FIG. 21, the driving range of the driving transistor DT can be greater than the driving range of the switching transistor SW and the leakage current of the switching transistor SW can be reduced while ensuring the stability of device characteristics of the thin-film transistor.

Hereinafter, a method of fabricating the display device 1_5 according to the embodiment of FIG. 21 will be described.

Figure 22:
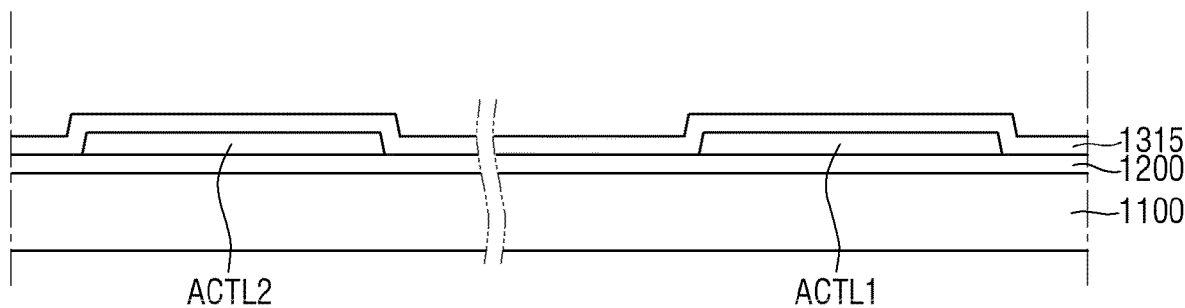
FIG. 22 is a view schematically showing a process of disposing a first insulating layer of a first gate insulating layer in a display device according to the embodiment of FIG. 21.
Figure 22:
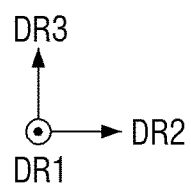
Figure 23:
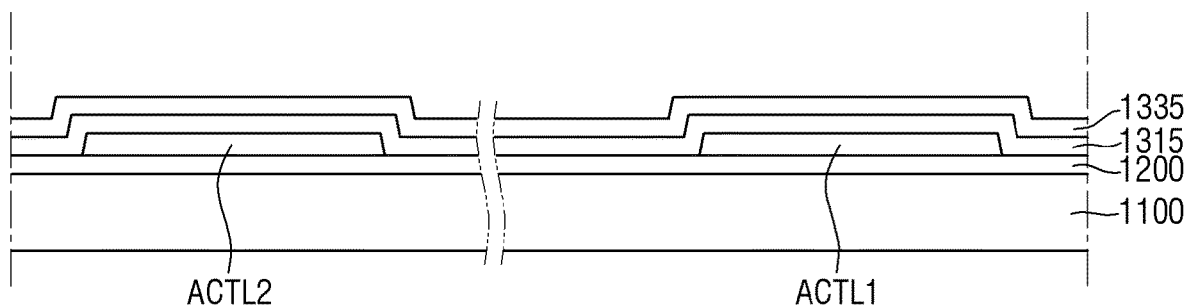
FIG. 23 is a view schematically showing a process of disposing a second insulating layer of a first gate insulating layer in a display device according to the embodiment of FIG. 21.
Figure 23:
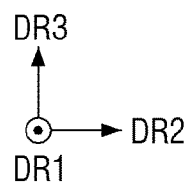
Figure 24:
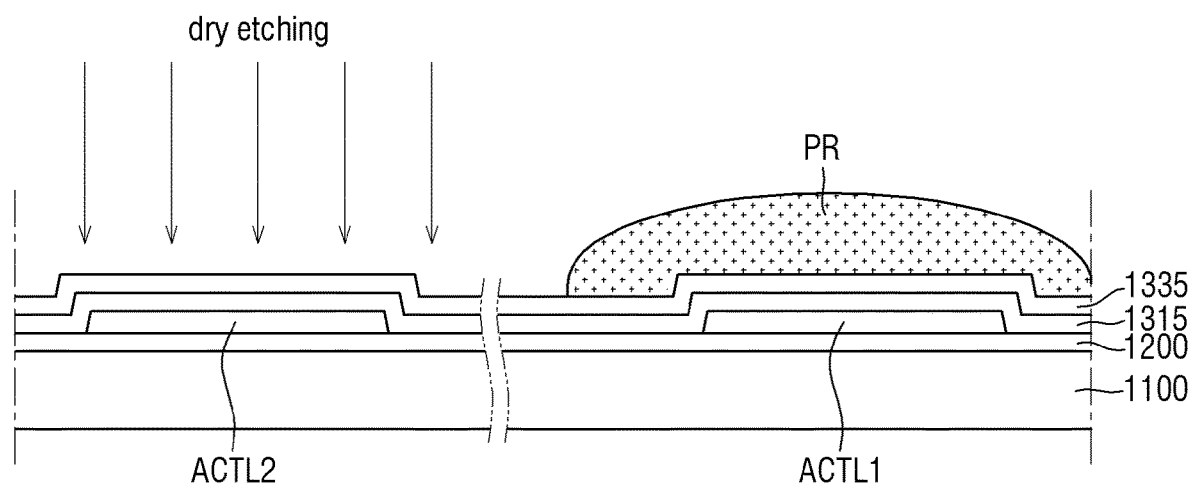
FIG. 24 is a view schematically showing a process of selectively etching a second insulating layer of a first gate insulating layer in a display device according to the embodiment of FIG. 21.

FIG. 22 is a view schematically showing a process of disposing a first insulating layer of a first gate insulating layer in a display device according to the embodiment of FIG. 21. FIG. 23 is a view schematically showing a process of disposing a second insulating layer of a first gate insulating layer in a display device according to the embodiment of FIG. 21. FIG. 24 is a view schematically showing a process of selectively etching a second insulating layer of a first gate insulating layer in a display device according to the embodiment of FIG. 21.

Referring to FIGS. 22 and 23, a first insulating layer 1315 and a second insulating layer 1335 are sequentially formed on a buffer layer 1200 on which a semiconductor layer ACTL is formed. For example, the first insulating layer 1315 may be formed on the buffer layer 1200 on which the semiconductor layer ACTL is formed, and then the second insulating layer 1335 may be formed on the first insulating layer 1315. The semiconductor layer ACTL may include the first area ACTL1 and the second area ACTL2 as described above. The second insulating layer 1335 may be disposed to have substantially the same thickness along the profile of the first insulating layer 1315, and may completely cover the first insulating layer 1315.

Referring to FIG. 24, a photosensitive organic material is applied onto the second insulating layer 1335, and it is exposed to light and developed to form a photoresist layer PR on a part of the second insulating layer 1335 overlapping the first area ACTL1 of the semiconductor layer ACTL in the third direction DR3. Then, the part of the second insulating layer 1335 overlapping the second area ACTL2 of the semiconductor layer ACTL is selectively etched by using the photoresist layer PR as an etch stop layer. For example, the process of selectively etching the third insulating layer 1350 may be performed by dry etching. The dry etching may be performed using carbon tetrafluoride (CF4) and $O_2$ plasma or a fluorine-based compound and $O_2$ plasma.

If the first insulating layer 1315 contains silicon oxide, a photoresist layer PR is formed on a part of the first insulating layer 1315 overlapping with the first area ACTL1 of the semiconductor layer ACTL in the third direction DR3, the part of the first insulating layer 1315 overlapping with the second area ACTL2 of the semiconductor layer ACTL is selectively etched using the photoresist layer PR, and then the second insulating layer is formed so as to adjust the thickness of the first gate insulating layer 1305, the semiconductor layer ACTL may be etched together with the first insulating layer 1315 during the dry etching. As a result, there may be problems that device characteristics of the thin-film transistor deteriorate and that the display device 1_5 is not turned on by etching the semiconductor layer ACTL.

Accordingly, the first insulating layer 1315 including a material having a higher dielectric constant than silicon oxide and having an interatomic bonding energy greater than the interatomic bonding energy of the material included in the second insulating layer 1335 is formed, and then the second insulating layer 1335 including silicon nitride and having substantially the same thickness along the profile of the first insulating layer 1315 to cover the first insulating layer 1315 is formed on the first insulating layer 1315. Subsequently, the photoresist layer PR is formed on the part of the second insulating layer 1335 overlapping with the first area ACTL1 of the semiconductor layer ACTL in the third direction DR3, and the part of the second insulating layer 1335 overlapping with the second area ACTL2 of the semiconductor layer ACTL in the third direction DR3 is selectively etched using the photoresist layer PR as an etch stop layer. In this manner, it is possible to prevent etching of the semiconductor layer ACTL and to ensure stability of device characteristics of the thin-film transistor.

If the photoresist layer PR is not completely removed by the dry etching, an additional process for removing the remaining photoresist layer PR may be carried out.

Subsequently, a first conductive layer CDL1 is formed on the first insulating layer 1315 and the second insulating layer 1335. As described above, the first conductive layer CDL1 may include a first gate pattern GAT1 and a second gate pattern GAT2. The first gate pattern GAT1 may overlap with the first area ACTL1 of the semiconductor layer ACTL in the third direction DR3. The second gate pattern GAT2 may overlap with the second area ACTL2 of the semiconductor layer ACTL in the third direction DR3. By forming the first conductive layer CDL1 on the third insulating layer 1350 and the second insulating layer 1330, the structure shown in FIG. 21 can be obtained.

According to the above-described method of fabricating the display device 1_5, the first insulating layer 1315 and the second insulating layer 1335 are substantially not etched, so that it is possible to fabricate the display device 1_5 in which the stability of device characteristics of the thin-film transistor can be ensured while the driving range of the driving transistor DT can be greater than the driving range of the switching transistor SW and the leakage current of the switching transistor SW can be reduced.

Figure 25:
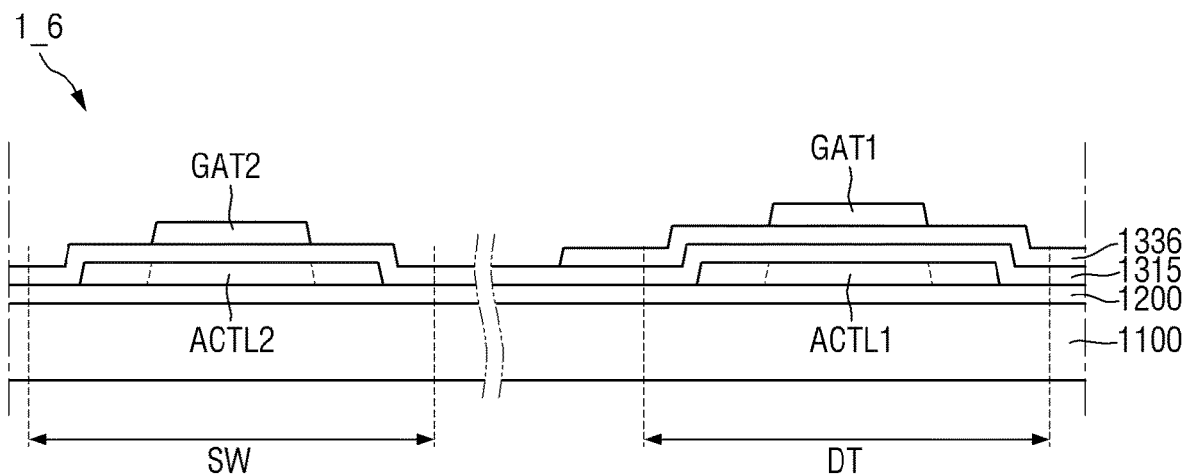
FIG. 25 is a structural diagram illustrating a structure of a first gate insulating layer above a driving transistor and a switching transistor in a display device according to yet another embodiment.

FIG. 25 is a structural diagram illustrating a structure of a first gate insulating layer on a driving transistor and a switching transistor in a display device according to yet another embodiment.

A display device 1_6 according to the embodiment of FIG. 25 is different from the display device 1_5 according to the embodiment of FIG. 21 in that a second insulating layer 1336 includes silicon oxide. Specifically, a first gate insulating layer 1306 on a driving transistor DT may include a first insulating layer 1315 containing a high-k material, and a second insulating layer 1336 containing silicon oxide. The dielectric constant of the first insulating layer 1315 may be greater than the dielectric constant of the second insulating layer 1336.

Figure 26:
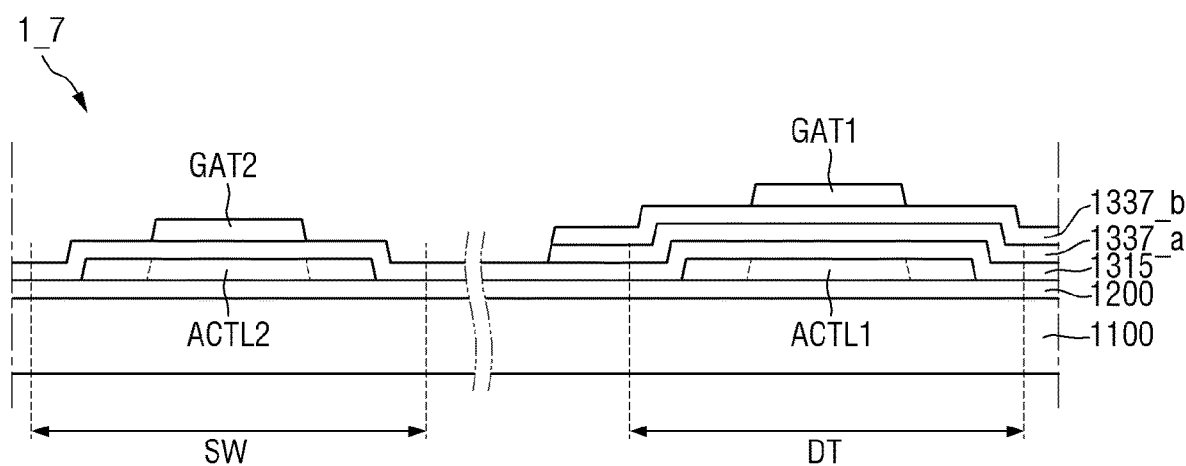
FIG. 26 is a structural diagram illustrating a structure of a first gate insulating layer above a driving transistor and a switching transistor in a display device according to yet another embodiment.

FIG. 26 is a structural diagram illustrating a structure of a first gate insulating layer on a driving transistor and a switching transistor in a display device according to yet another embodiment.

A display device 1_7 according to the embodiment of FIG. 26 is different from the display device 1 according to the embodiment of FIG. 21 in that a second insulating layer 1337 includes a (2_1) insulating layer 1337_a and a (2_2) insulating layer 1337_b. Specifically, the first gate insulating layer 1307 on the driving transistor DT may include a first insulating layer 1315, a (2_1) insulating layer 1337_a disposed on the first insulating layer 1315, and a (2_2) insulating layer 1337_b disposed on the (2_1) insulating layer 1337_a. In other words, the second insulating layer 1337 may have a multilayer structure including the (2_1) insulating layer 1337_a and the (2_2) insulating layer 1337_b disposed on the (2_1) insulating layer 1337_a.

The dielectric constant of the first insulating layer 1315 may be greater than the dielectric constant of the (2_1) insulating layer 1337_a and the dielectric constant of the (2_2) insulating layer 1337_b.

In some embodiments, the (2_1) insulating layer 1337_a may include silicon oxide, and the (2_2) insulating layer 1337_b may include silicon nitride. It should be understood, however, that the disclosure is not limited thereto. For example, the (2_1) insulating layer 1337_a may include silicon nitride, and the (2_2) insulating layer 1337_b may include silicon oxide.

In some embodiments, the second insulating layer 1337 may include, but is not limited to, a double-layer structure. For example, the second insulating layer 1337 may have a triple-layer structure.

Figure 27:
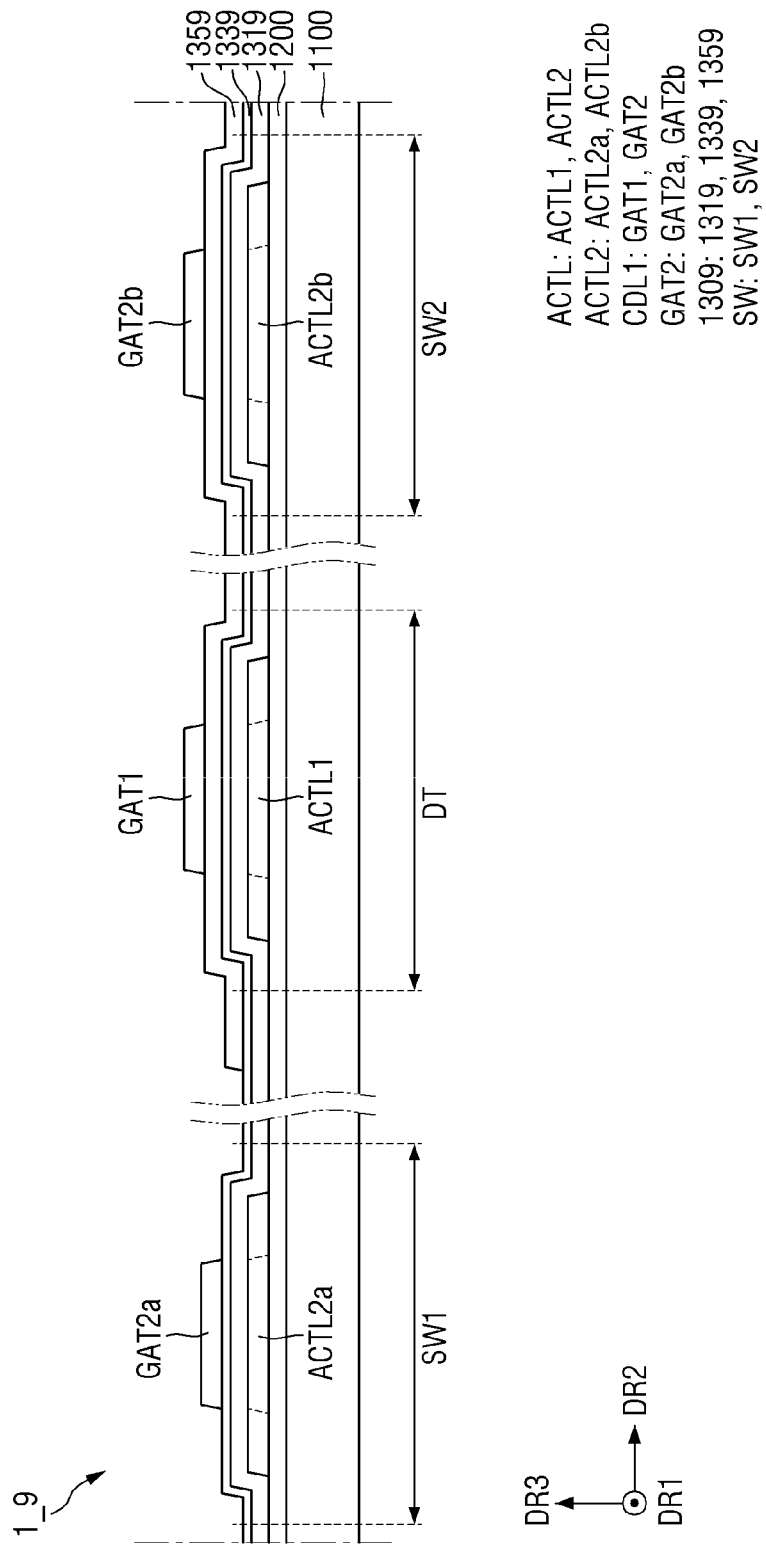
FIG. 27 is a structural diagram illustrating a structure of a first gate insulating layer above a driving transistor and a switching transistor in a display device according to yet another embodiment.

FIG. 27 is a structural diagram illustrating a structure of a first gate insulating layer on a driving transistor and a switching transistor in a display device according to yet another embodiment.

In a display device 1_9 according to this embodiment of FIG. 27, the thickness of a first gate insulating layer 1309 on a driving transistor DT and a second switching transistor SW2 of a switching element is larger than the thickness of the first gate insulating layer 1309 on a first switching transistor SW1 of the switching transistor SW. In other words, the first gate insulating layer 1309 on the driving transistor DT and the second switching transistor SW2 have the same cross-sectional structure including the first insulating layer 1319, the second insulating layer 1339 and the third insulating layer 1359, while the first gate insulating layer 1309 on the first switching transistor SW1 has the cross-sectional structure including the first insulating layer 1319 and the second insulating layer 1339. The first insulating layer 1319, the second insulating layer 1339 and the third insulating layer 1359 according to this embodiment may be substantially identical to the first insulating layer 1310, the second insulating layer 1330 and the third insulating layer 1350 according to the embodiment of FIG. 8, respectively.

Specifically, the first gate insulating layer 1309 may include the first insulating layer 1319, the second insulating layer 1339 and the third insulating layer 1359. The second insulating layer 1339 may be disposed on the first insulating layer 1319, and the third insulating layer 1359 may be disposed on the second insulating layer 1339. The first gate insulating layer 1309 may partially include the third insulating layer 1359. In this instance, the second insulating layer 1339 may be disposed between the third insulating layer 1359 and the first insulating layer 1319. In other words, the first gate insulating layer 1309 may include the first insulating layer 1319, the second insulating layer 1339 and the third insulating layer 1359 where it overlaps with the driving transistor DT and the second switching transistor SW2 in the third direction DR3, while it may include the first insulating layer 1319 and the second insulating layer 1339 where it overlaps with the first switching transistor SW1 in the third direction DR3. Accordingly, since the first gate insulating layer 1309 on the first area ACTL1 and the (2_2) area of the semiconductor layer ACTL further includes the third insulating layer 1359 compared to the first gate insulating layer 1309 on the (2_1) area ACTL2a of the semiconductor layer ACTL, the thickness of the first gate insulating layer 1309 on the (2_1) area ACTL2a of the semiconductor layer ACTL may be smaller than the thickness of the first gate insulating layer 1309 on the first area ACTL1 and the (2_2) area ACTL2b of the semiconductor layer ACTL.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
   a substrate;
   a semiconductor layer disposed on the substrate and comprising a first area and a second area;
   a first conductive layer disposed on the semiconductor layer and comprising a first gate pattern overlapping with the first area and a second gate pattern overlapping with the second area; and
   a first gate insulating layer disposed between the semiconductor layer and the first conductive layer and comprising a first insulating layer overlapping the first area and the second area, a second insulating layer overlapping the first area and the second area, and a third insulating layer not overlapping the first area but overlapping the second area,
   wherein the second insulating layer is disposed between the first insulating layer and the third insulating layer, and has a dielectric constant greater than that of the third insulating layer.

2. The display device of claim 1,
   wherein the second insulating layer has a higher dielectric constant than that of the first insulating layer.

3. The display device of claim 2,
   wherein the first insulating layer comprises silicon oxide and has a thickness of 600 Å to 1,200 Å, and
   wherein the second insulating layer has a thickness of 100 Å to 300 Å.

4. The display device of claim 3,
   wherein a first oxide thickness of a first part of the first gate insulating layer which overlaps the first area is less than a second oxide thickness of a second part of the first gate insulating layer which overlaps the second area.

5. The display device of claim 4,
   wherein the first oxide thickness of the first part of the first gate insulating layer which overlaps the first area ranges from 1,000 Å to 1,500 Å, and
   the second oxide thickness of the second part of the first gate insulating layer which overlaps the second area ranges from 1,250 Å to 1,750 Å.

6. The display device of claim 5,
   wherein the first oxide thickness of the first part of the first gate insulating layer which overlaps the first area is less than the second oxide thickness of the second part of the first gate insulating layer which overlaps the second area by 250 Å to 300 Å.

7. The display device of claim 6, further comprising:
   a light-emitting element disposed on the substrate,
   wherein the second area and the second gate pattern forms a driving transistor configured to receive a driving voltage to supply a driving current to the light-emitting element, and
   wherein the first area and the first gate pattern forms a switching transistor configured to transmit a data signal to the driving transistor.

8. The display device of claim 1,
   wherein an interatomic bonding energy of a material of the second insulating layer is greater than an interatomic bonding energy of a material of the third insulating layer.

9. The display device of claim 1,
   wherein the dielectric constant of the second insulating layer is greater than or equal to 8 and less than or equal to 30.

10. The display device of claim 1,
    wherein the first insulating layer comprises silicon oxide,
    wherein the second insulating layer comprises at least one of aluminum oxide ($Al_2O_3$), zirconium oxide ($ZrO_2$), hafnium oxide ($HfO_2$), yttrium oxide ($Y_2O_3$), tantalum pentoxide ($Ta_2O_5$), and cerium oxide ($CeO_2$), and
    wherein the third insulating layer comprises silicon nitride.

* * * * *